United States Patent
Kuo et al.

(10) Patent No.: US 12,349,426 B2
(45) Date of Patent: Jul. 1, 2025

(54) SOURCE/DRAIN DEVICE AND METHOD OF FORMING THEREOF

(71) Applicant: Taiwan Semiconductor Manufacturing Co., Ltd., Hsinchu (TW)

(72) Inventors: Chien-I Kuo, Chiayi County (TW); Wei Hao Lu, Taoyuan (TW); Li-Li Su, ChuBei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/636,490

(22) Filed: Apr. 16, 2024

(65) Prior Publication Data

US 2024/0266398 A1 Aug. 8, 2024

Related U.S. Application Data

(62) Division of application No. 17/458,950, filed on Aug. 27, 2021, now Pat. No. 11,990,511.

(51) Int. Cl.
| | |
|---|---|
| *H01L 29/94* | (2006.01) |
| *H01L 29/76* | (2006.01) |
| *H10D 30/01* | (2025.01) |
| *H10D 30/62* | (2025.01) |
| *H10D 62/10* | (2025.01) |
| *H10D 62/13* | (2025.01) |

(Continued)

(52) U.S. Cl.
CPC ......... *H10D 62/151* (2025.01); *H10D 30/024* (2025.01); *H10D 30/6211* (2025.01); *H10D 62/115* (2025.01); *H10D 84/013* (2025.01); *H10D 84/0151* (2025.01); *H10D 84/0158* (2025.01); *H10D 84/038* (2025.01)

(58) Field of Classification Search
CPC ............... H10D 62/151; H10D 30/024; H10D 30/6211; H10D 62/115; H10D 84/013; H10D 84/0151; H10D 84/0158; H10D 84/038; H10D 30/62; H10D 84/0193
USPC .......................................................... 257/288
See application file for complete search history.

(56) References Cited

U.S. PATENT DOCUMENTS

| | | |
|---|---|---|
| 5,489,860 A | 2/1996 | Kitagawa et al. |
| 6,950,354 B1 | 9/2005 | Akiyoshi |
| 7,236,396 B2 | 6/2007 | Houston et al. |

(Continued)

FOREIGN PATENT DOCUMENTS

| | | |
|---|---|---|
| TW | 200744099 A | 12/2007 |
| TW | 201312574 A | 3/2013 |

(Continued)

*Primary Examiner* — Theresa T Doan
(74) *Attorney, Agent, or Firm* — Slater Matsil, LLP

(57) ABSTRACT

A method of forming a semiconductor includes forming a first recess in a first semiconductor fin protruding from a substrate and forming a second recess in a second semiconductor fin protruding from the substrate first semiconductor fin and forming a source/drain region in the first recess and the second recess. Forming the source/drain region includes forming a first portion of a first layer in the first recess and forming a second portion of the first layer in the second recess, forming a second layer on the first layer by flowing a first precursor, and forming a third layer on the second layer by flowing a second precursor, the third layer being a single continuous material.

20 Claims, 36 Drawing Sheets

(51) Int. Cl.
*H10D 84/01* (2025.01)
*H10D 84/03* (2025.01)

(56) References Cited

U.S. PATENT DOCUMENTS

| | | |
|---|---|---|
| 8,035,170 B2 | 10/2011 | Inaba |
| 8,421,205 B2 | 4/2013 | Yang |
| 8,455,028 B2 | 6/2013 | Breunig et al. |
| 8,487,378 B2 | 7/2013 | Goto et al. |
| 8,605,523 B2 | 12/2013 | Tao et al. |
| 8,630,132 B2 | 1/2014 | Cheng et al. |
| 8,661,389 B2 | 2/2014 | Chern et al. |
| 8,693,235 B2 | 4/2014 | Liaw |
| 8,698,205 B2 | 4/2014 | Tzeng et al. |
| 8,729,634 B2 | 5/2014 | Shen et al. |
| 8,760,948 B2 | 6/2014 | Tao et al. |
| 8,826,212 B2 | 9/2014 | Yeh et al. |
| 8,826,213 B1 | 9/2014 | Ho et al. |
| 8,836,141 B2 | 9/2014 | Chi et al. |
| 8,887,106 B2 | 11/2014 | Ho et al. |
| 8,962,400 B2 | 2/2015 | Tsai et al. |
| 9,093,514 B2 | 7/2015 | Tsai et al. |
| 9,093,530 B2 | 7/2015 | Huang et al. |
| 9,129,707 B2 | 9/2015 | Lin et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,644 B2 | 2/2017 | Liaw |
| 9,576,814 B2 | 2/2017 | Wu et al. |
| 9,601,342 B2 | 3/2017 | Lee et al. |
| 9,608,116 B2 | 3/2017 | Ching et al. |
| 9,721,645 B1 | 8/2017 | Liaw |
| 9,812,363 B1 | 11/2017 | Liao et al. |
| 9,859,380 B2 | 1/2018 | Lee et al. |
| 9,935,001 B2 | 4/2018 | Liaw |
| 2002/0001251 A1 | 1/2002 | Fujino et al. |
| 2005/0219914 A1 | 10/2005 | Sarin et al. |
| 2006/0171194 A1 | 8/2006 | Lowrey et al. |
| 2007/0283084 A1 | 12/2007 | Chiu et al. |
| 2008/0091969 A1 | 4/2008 | Kurumada et al. |
| 2008/0197412 A1 | 8/2008 | Zhang et al. |
| 2008/0253171 A1 | 10/2008 | Terada et al. |
| 2009/0108308 A1 | 4/2009 | Yang et al. |
| 2011/0062498 A1 | 3/2011 | Yang et al. |
| 2012/0294100 A1 | 11/2012 | Ling et al. |
| 2013/0026538 A1 | 1/2013 | Liao et al. |
| 2013/0181297 A1 | 7/2013 | Liaw |
| 2013/0235640 A1 | 9/2013 | Liaw |
| 2014/0032871 A1 | 1/2014 | Hsu et al. |
| 2014/0054716 A1 | 2/2014 | Chen et al. |
| 2014/0119131 A1 | 5/2014 | Verma et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0215420 A1 | 7/2014 | Lin et al. |
| 2014/0233330 A1 | 8/2014 | Ko et al. |
| 2014/0241077 A1 | 8/2014 | Katoch et al. |
| 2014/0264924 A1 | 9/2014 | Yu et al. |
| 2014/0269114 A1 | 9/2014 | Yang et al. |
| 2014/0282289 A1 | 9/2014 | Hsu et al. |
| 2014/0282326 A1 | 9/2014 | Chen et al. |
| 2014/0325466 A1 | 10/2014 | Ke et al. |
| 2015/0187940 A1 | 7/2015 | Huang et al. |
| 2016/0027918 A1 | 1/2016 | Kim et al. |
| 2017/0077244 A1 | 3/2017 | Chang |
| 2017/0186748 A1 | 6/2017 | Lee et al. |
| 2020/0105526 A1 | 4/2020 | Chin et al. |
| 2020/0168723 A1 | 5/2020 | Hsu et al. |
| 2020/0340113 A1 | 10/2020 | Hatanpää et al. |

FOREIGN PATENT DOCUMENTS

| | | |
|---|---|---|
| TW | 201432677 A | 8/2014 |
| WO | 2009059906 A1 | 5/2009 |

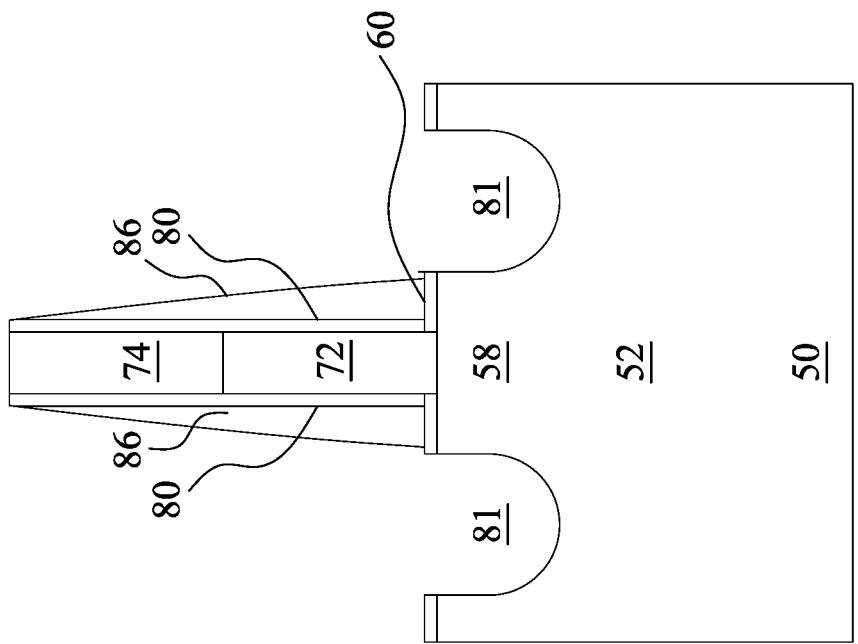
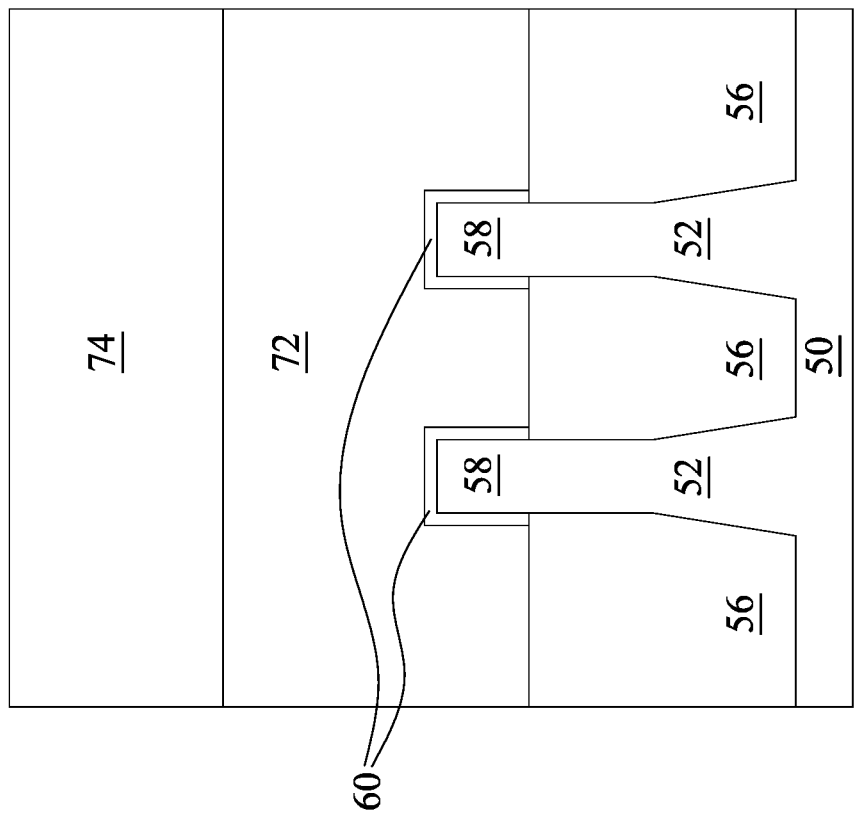
Fig. 10B
Fig. 10A

SOURCE/DRAIN DEVICE AND METHOD OF FORMING THEREOF

PRIORITY CLAIM AND CROSS-REFERENCE

This application is a divisional of U.S. patent application Ser. No. 17/458,950, filed on Aug. 27, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5, 6A, 6B, 7, 8A, 8B, 9A, 9B, 9C, 10A, 10B, 10C, 11A, 11B, 11C, 12A, 12B, 12C, 13A, 13B, 13C, 13D, 13E, 13F, 14A, 14B, 14C, 15A, 15B, 15C 16A, 16B, 16C, 17A, 17B, 17C, 17D, 18A, 18B, 18C, 19A, 19B, and 19C are cross-sectional views of intermediate stages in the manufacturing of FinFETs, in accordance with some embodiments.

DETAILED DESCRIPTION

Figure 1:
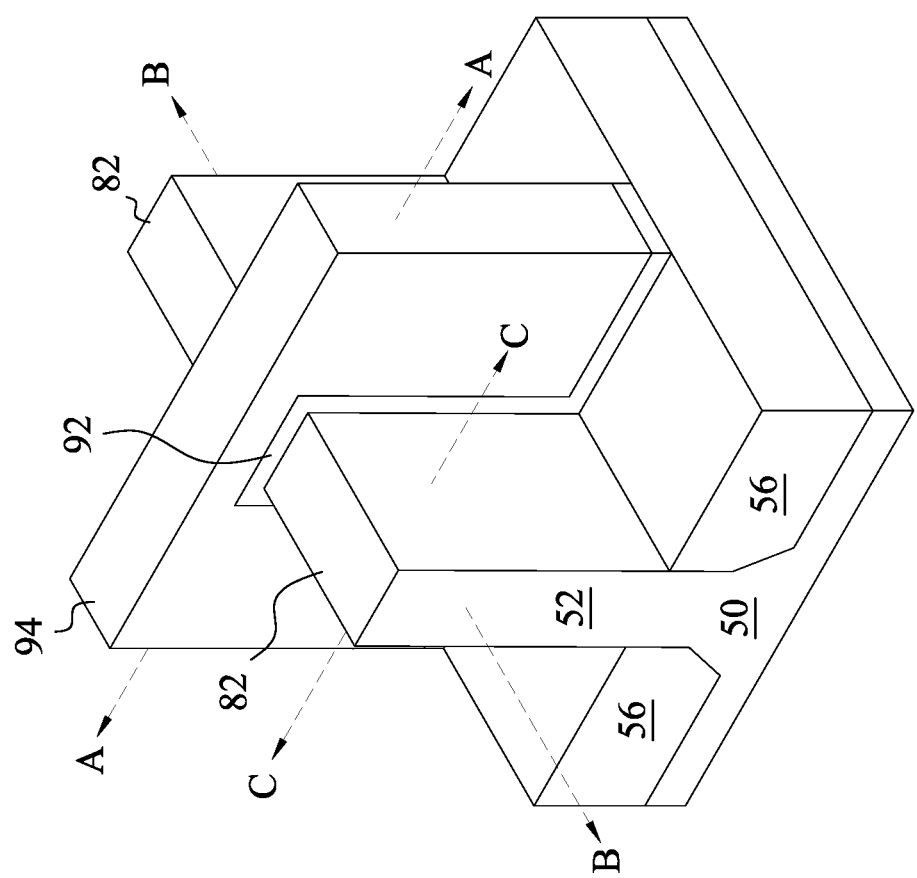
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, increased merge heights of source/drain regions may be produced with epitaxial growth techniques including an intermediate source/drain layer. Larger air gaps underneath source/drain regions may be obtained, which may lead to reduced gate to source/drain capacitance and improved AC performance of subsequently formed devices. The epitaxial growth process including an intermediate source/drain layer may allow for a good process window, which may enable merging of neighboring source/drain regions without producing undesired electric shorts while also providing substantially flat top profiles of the source/drain regions to enable reduced contact resistance.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 19C are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A, and 19A are illustrated along reference cross-section A-A illustrated in FIG. 1, and FIGS.

8B, 9B, 10B, 11B, 12B, 13B, 14B, 14C, 15B, 16B, 17B, 17C, 18B, and 19B are illustrated along a similar cross-section B-B illustrated in FIG. 1, except for multiple fins/FinFETs. FIGS. 9C, 10C, 11C, 12C, 13C, 13D, 13E, 13F, 14C, 15C, 16C, 17D, 18C, and 19C are illustrated along reference cross-section C-C illustrated in FIG. 1, except for multiple fins/FinFETs.

Figure 2:
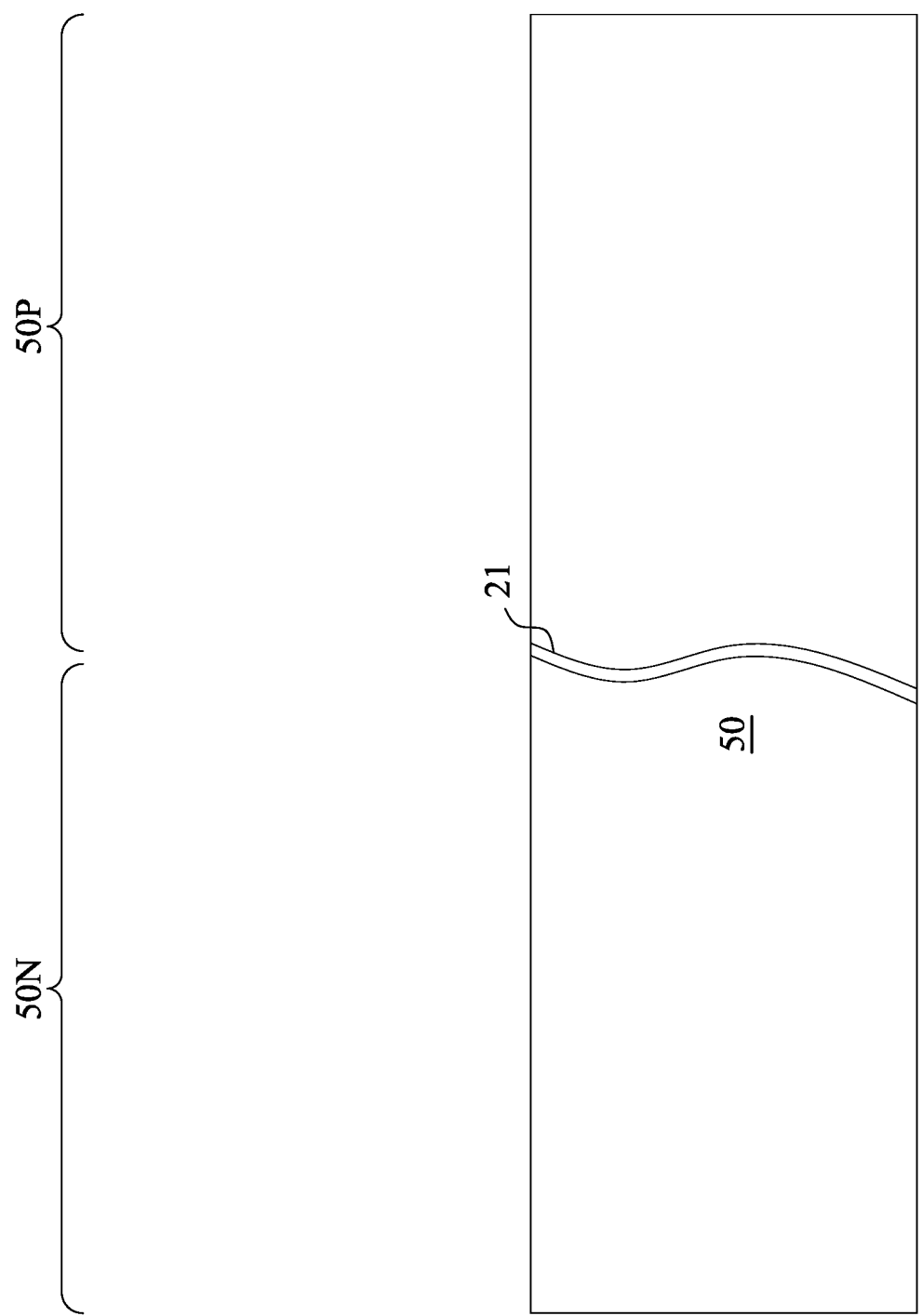

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 21), and any number of device features (e.g., other active devices, doped regions, isolation structures, etc.) may be disposed between the n-type region 50N and the p-type region 50P.

Figure 3A:
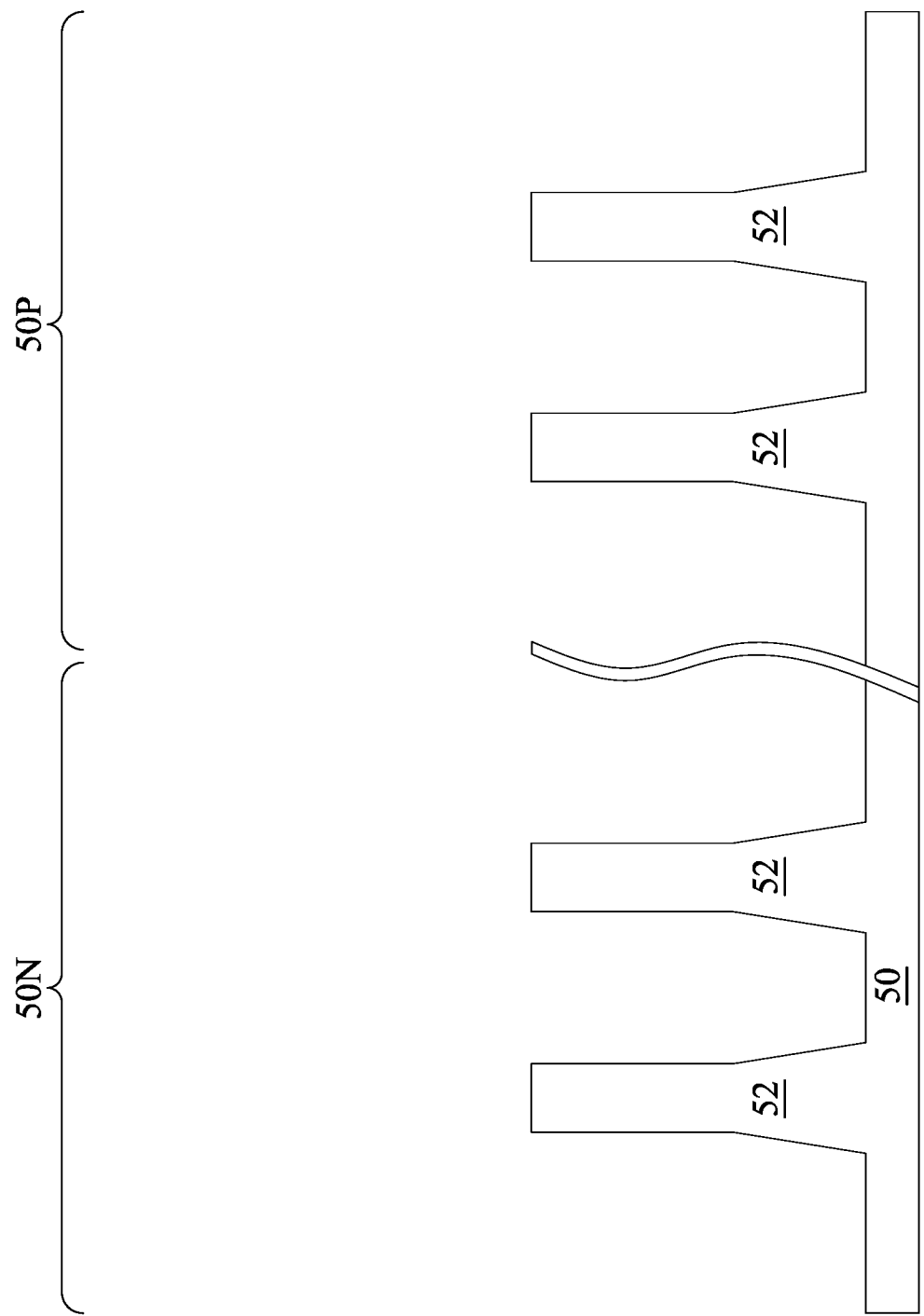

In FIG. 3A, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 3B:
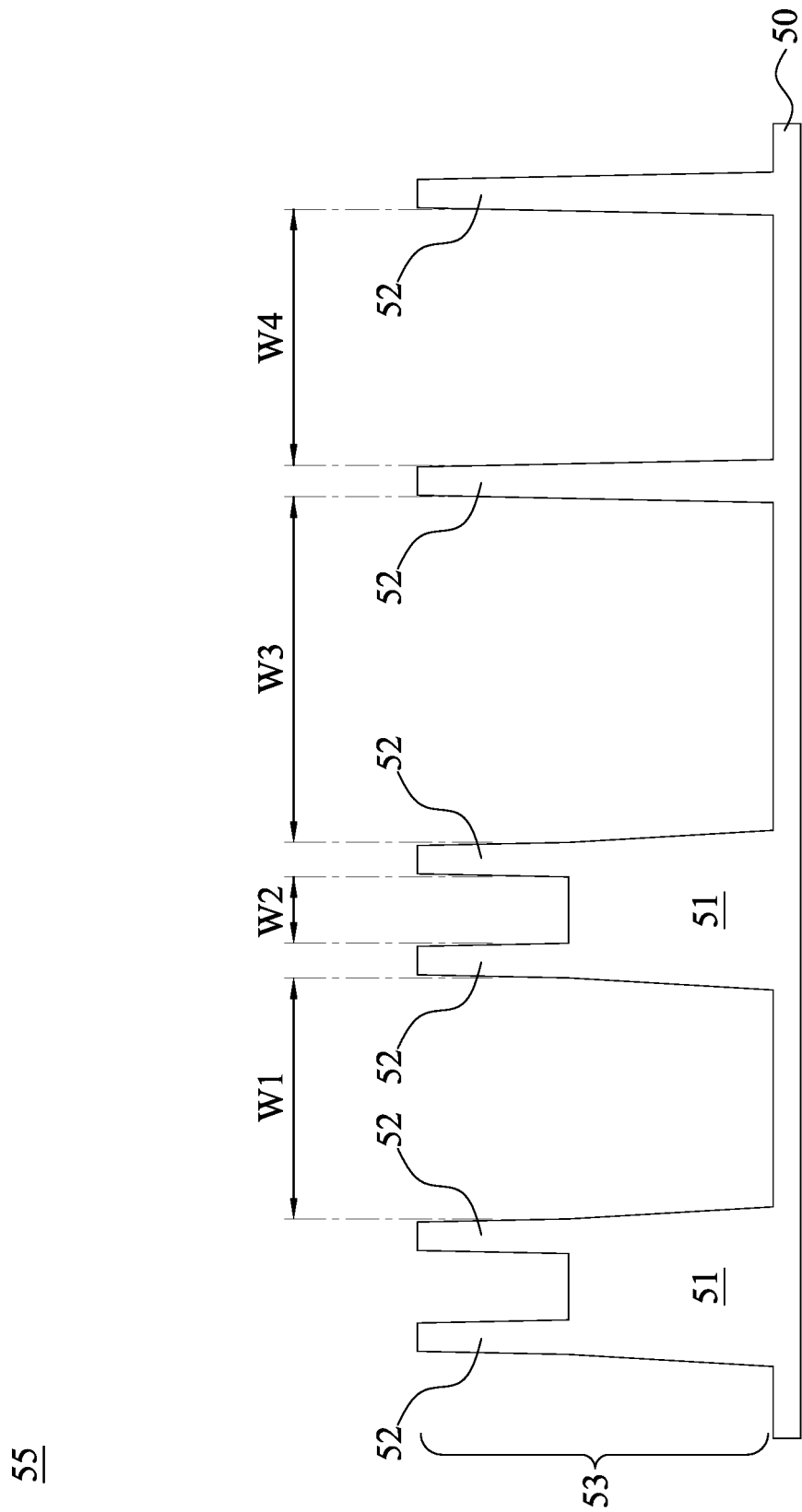

FIG. 3B illustrates a region 55 with two single fins 52 and two double fins 53 extending from the substrate 50, in accordance with some embodiments. The region 55 may be integrated in a same device as the regions 50N and 50P illustrated in and described with FIG. 3A, above. The region 55 may be used to form two double fin FinFETs and two single fin FinFETs. In some embodiments, the region 55 is used to form part of a static random access memory (SRAM) cell, such as an n-type SRAM cell. The single fins 52 and the double fins 53 may be formed with substantially similar materials and methods as the fins 52 described above with respect to FIG. 3A. The single fins 52 have a non-crown structure, in which a plurality of fins 52 are directly connected to the bulk portion of the substrate 50. The double fins 53 have a crown structure comprising a semiconductor base 51 and fins 52 protruding from the semiconductor base. Although FIG. 3B illustrates two single fins 52 and two double fins 53, any number of single fins 52 and double fins 53 may be formed.

In some embodiments, the double fins 53 are separated from each other by a width W1 in a range of about 40 nm to about 50 nm, which may be advantageous to reduce formations of shorts by undesired merging of subsequently formed source/drain regions on adjacent double fins 53.

In some embodiments, the protruding fins 52 of the double fins 53 are separated from each other by a width W2 in a range of about 5 nm to about 30 nm. In some embodiments, the nearest single fin 52 and double fin 53 are separated by a width W3 in a range of about 50 nm to about 200 nm. In some embodiments, adjacent single fins 52 are separated by a width W4 in a range of about 15 nm to about 40 nm. Various subsequent figures and processing steps may be described with respect to any of Regions 50N, 50P, or 55, and it should be understood that the same processing steps are applied to each of the regions 50N, 50P, and 55 unless otherwise noted.

Figure 4:
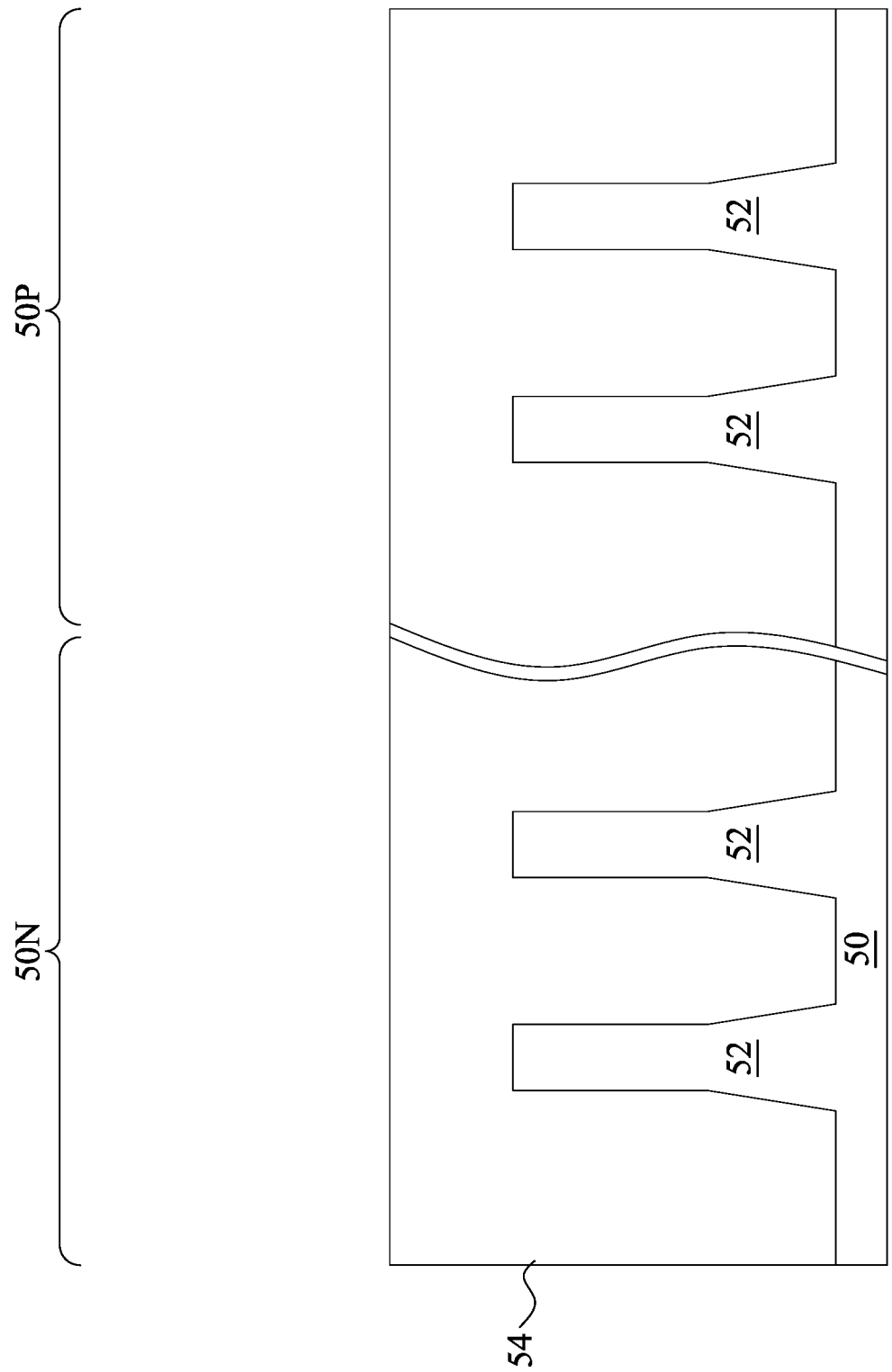

Following from FIG. 3A, in FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
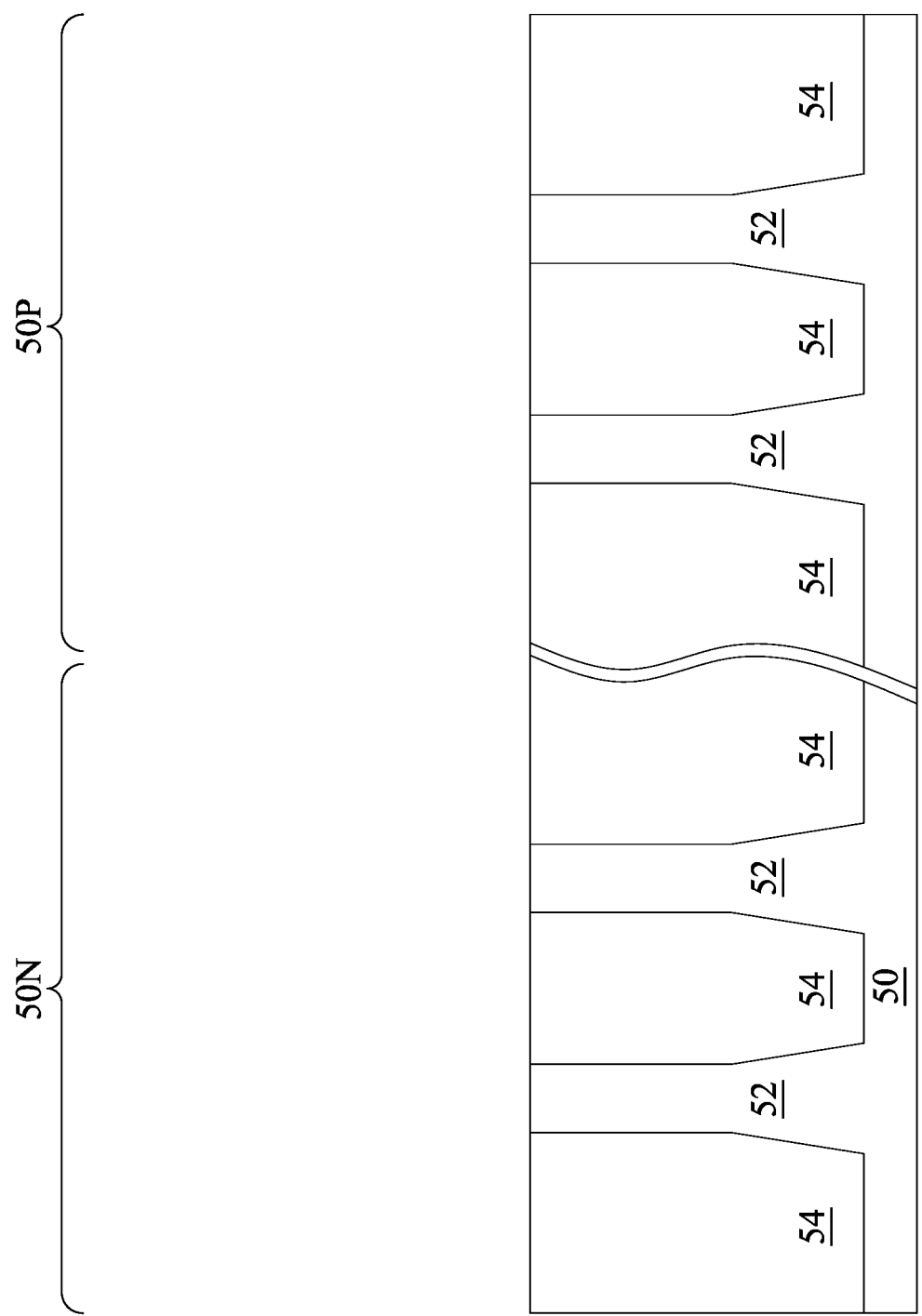

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6A:
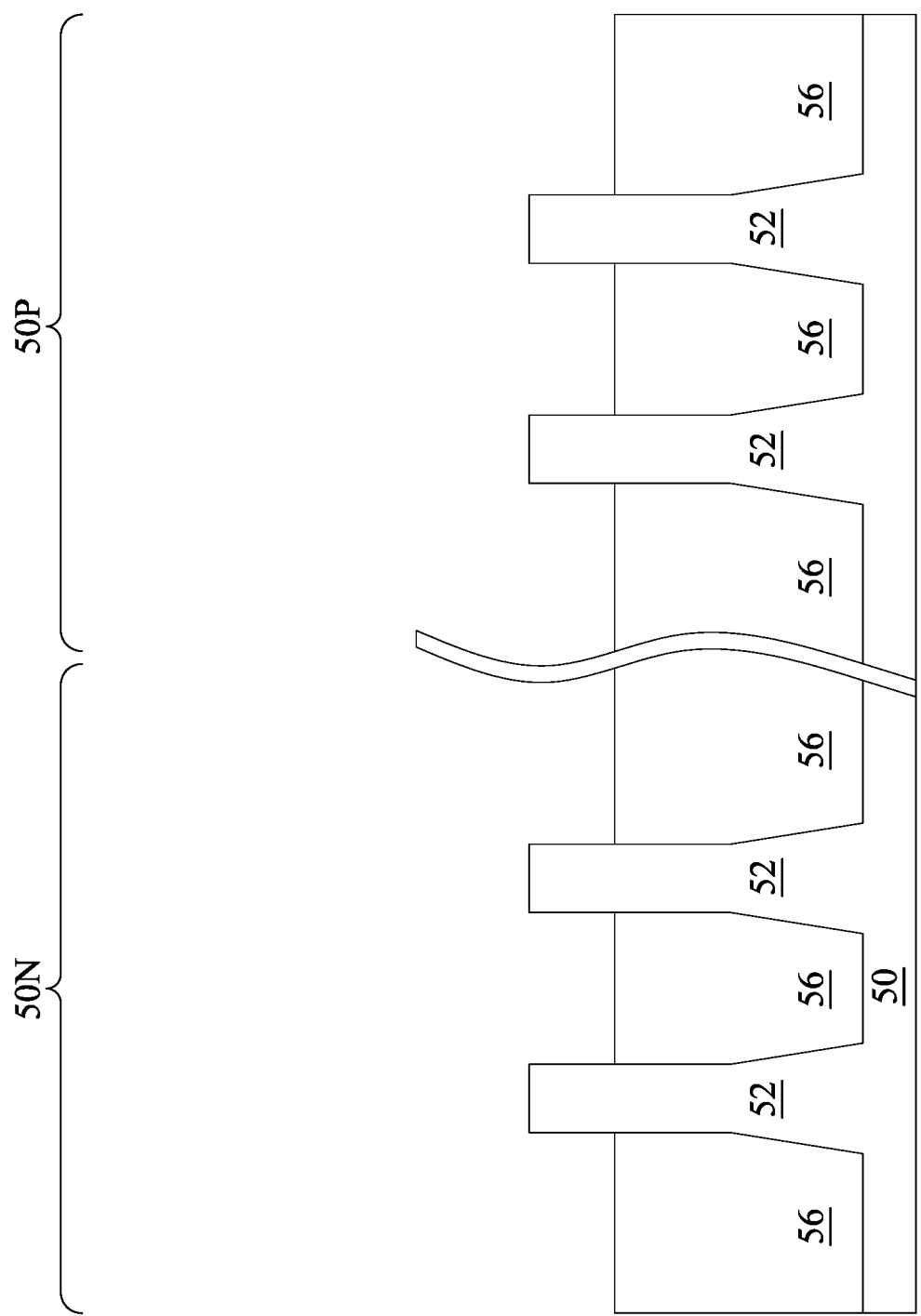

In FIG. 6A, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

Figure 6B:
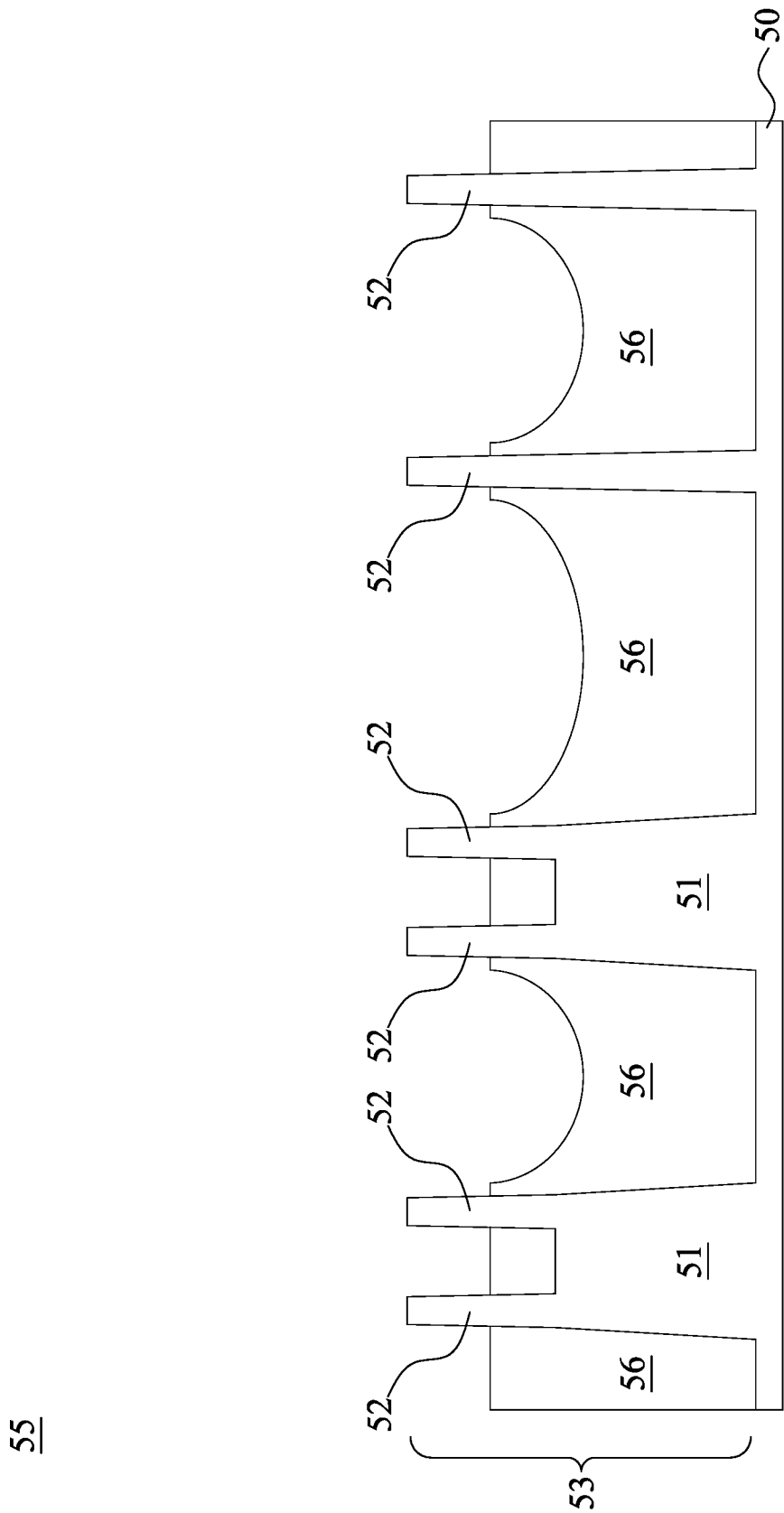

FIG. 6B illustrates the region 55 after STI regions 56 are formed over the substrate and between neighboring single fins 52 and double fins 53. The STI regions 56 may be formed over the semiconductor bases 51 and between the protruding fins 52 of the double fins 53. In some embodiments as illustrated in FIG. 6B, top surfaces of the STI regions 56 are flat between the protruding fins 52 of the double fins 53 and are concave between neighboring fins single fins 52 and between neighboring single fins 52 and double fins 53. However, the top surfaces of the STI regions 56 may have flat surfaces, concave surfaces, convex surfaces, or a combination thereof.

The process described with respect to FIGS. 2 through 6B is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIGS. 6A and 6B, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
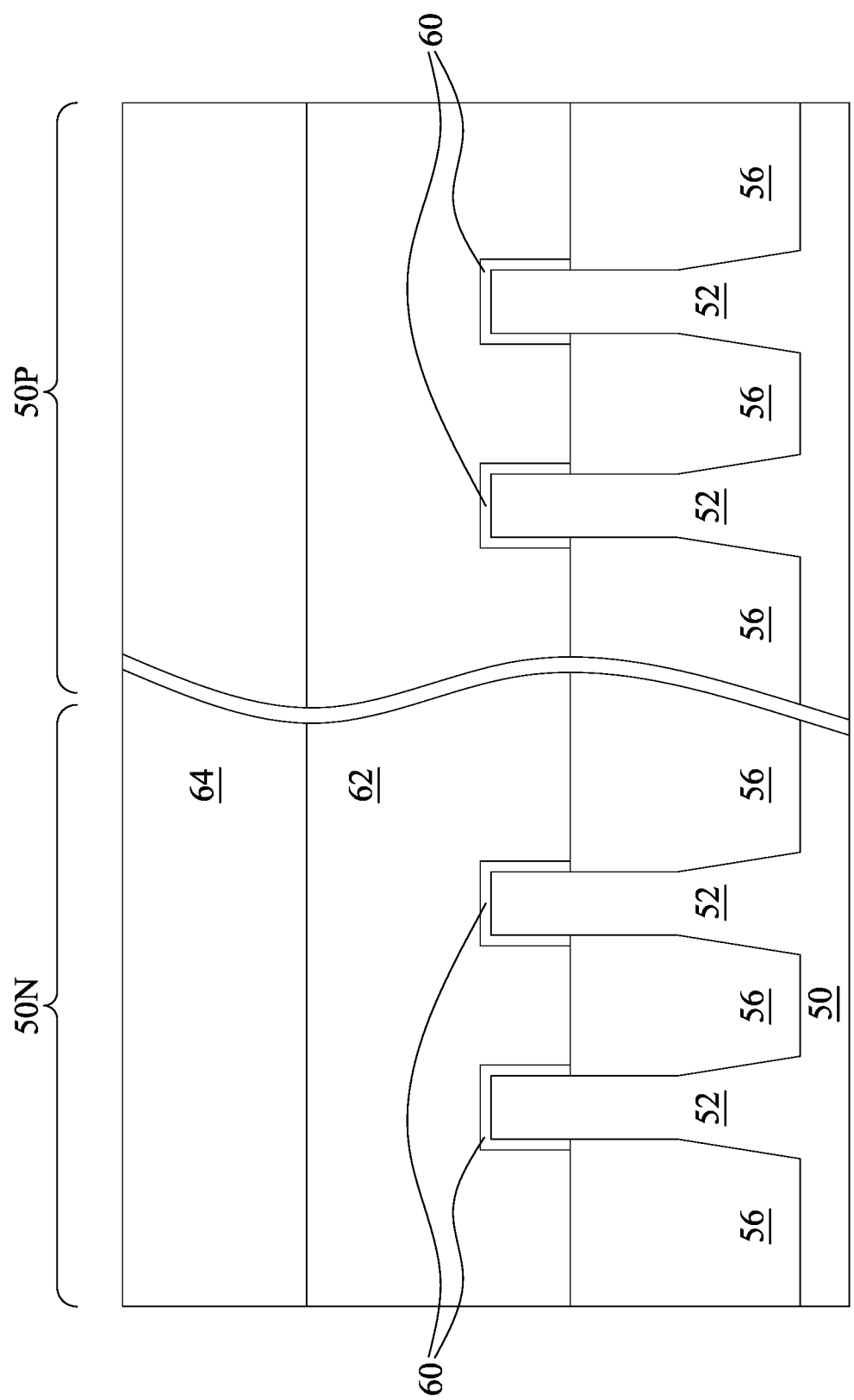

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 19C illustrate various additional steps in the manufacturing of embodiment devices. FIGS. 8A through 19C illustrate features in either of the n-type region 50N and the p-type region 50P. For example, the structures illustrated in FIGS. 8A through 19C may be applicable to both the n-type region 50N and the p-type region 50P. Differences (if any) in the structures of the n-type region 50N and the p-type region 50P are described in the text accompanying each figure.

Figure 8B:
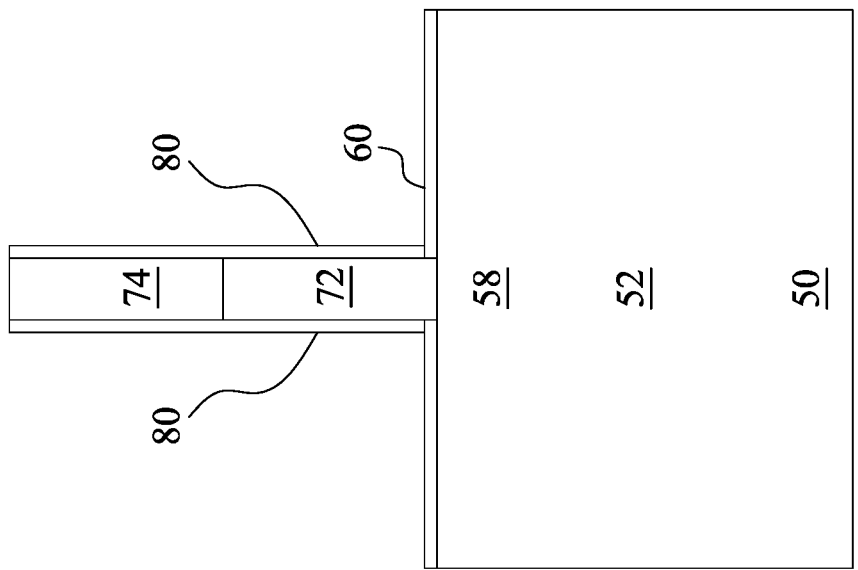
Figure 8A:
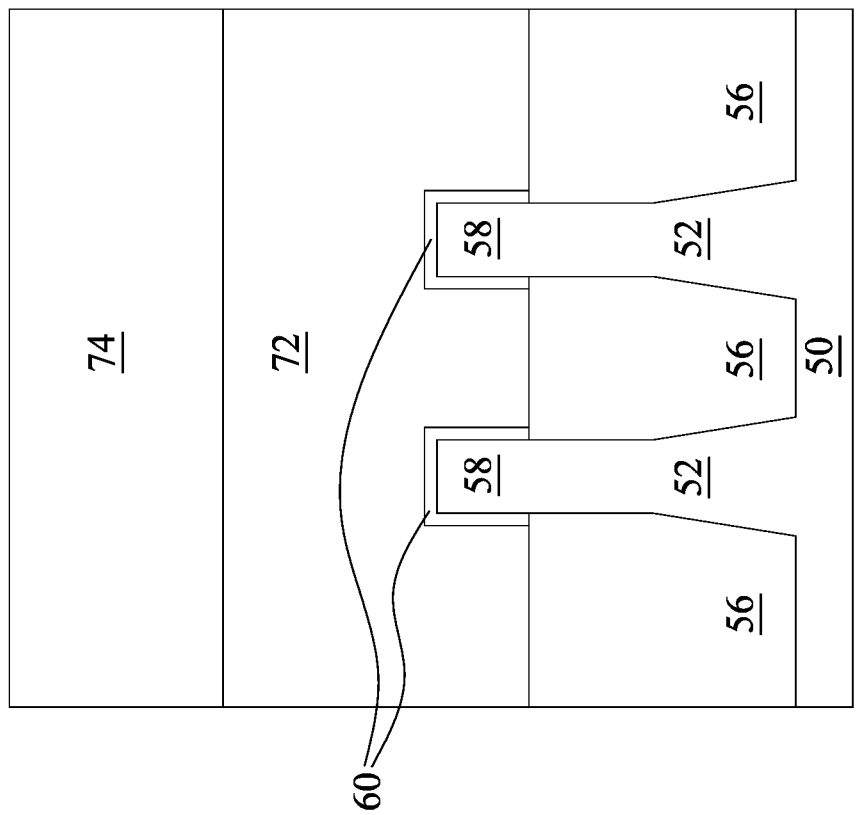

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
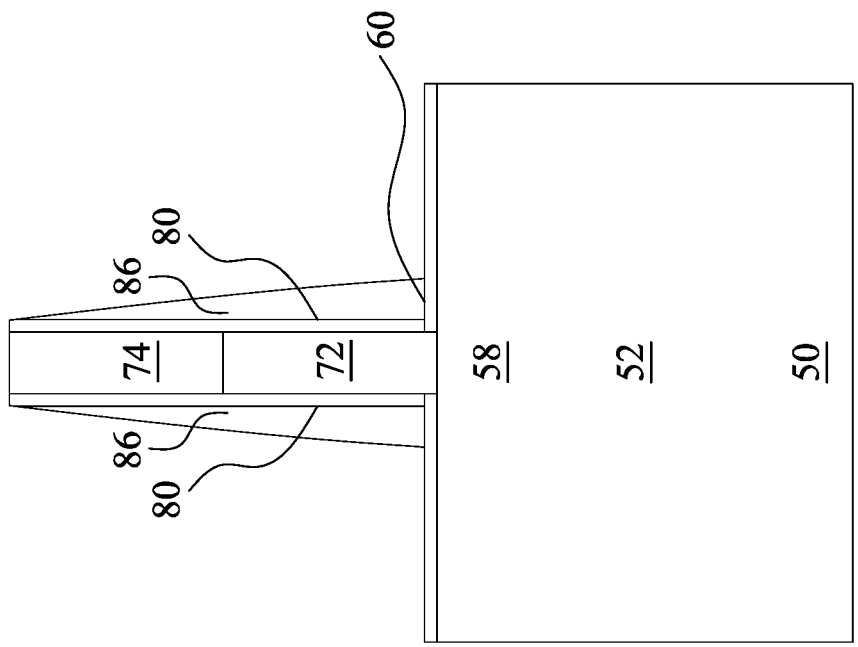
Figure 9A:
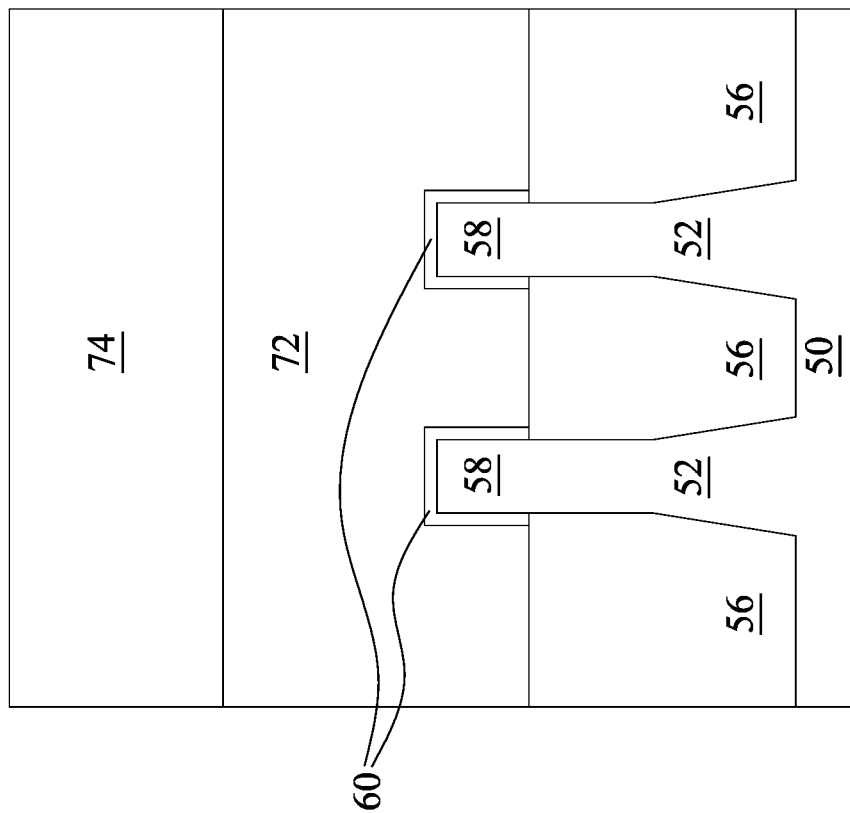
Figure 9C:
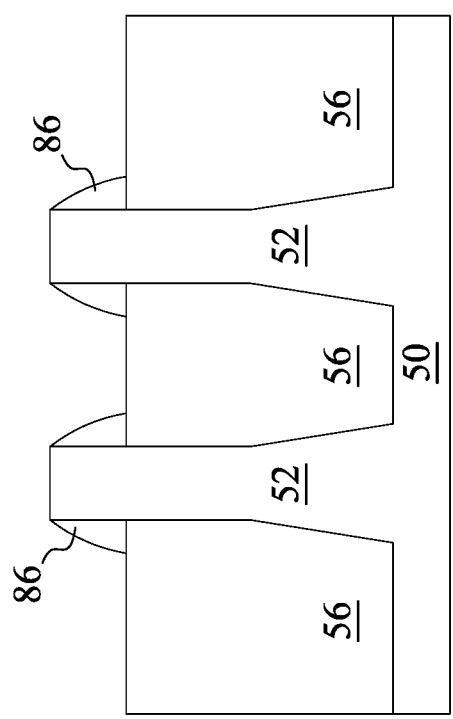

In FIGS. 9A, 9B, and 9C, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. In some embodiments as illustrated in FIG. 9C, the gate spacers 86 are further formed to cover a portion of the sidewalls of the fins 52 that extend above the STI regions 56, which may be useful for guiding the subsequent epitaxial growth of source/drain regions (see below, FIGS. 10B-13D). In some other embodiments, the spacer etch used to form the gate spacers 86 may be adjusted to remove the spacer material to allow the subsequently epitaxially grown region to extend to the surface of the STI region 56.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10C:
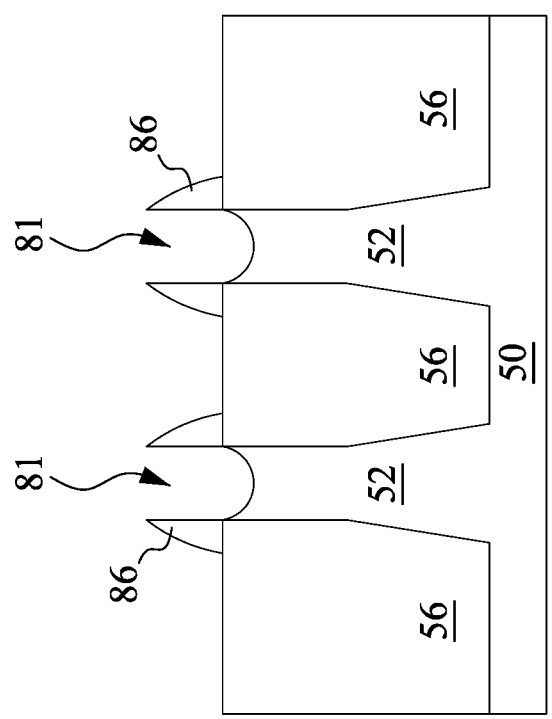

In FIGS. 10A, 10B, and 10C recesses 81 are etched in the fins 52. The etch process can be isotropic or anisotropic, and it may be selective with respect to one or more crystalline planes of the fin material. As a result, the recesses 81, shown in FIGS. 10B and 10C as having round bottom profiles, can in practice have various profile shapes based on the etch process implemented. The etch process may be a dry etch, such as a RIE, NBE, or the like, and/or a wet etch, such as one using tetramethylammonium hydroxide (TMAH), ammonium hydroxide (NH$_4$OH), or other etchants. FIG. 10B illustrates the recesses 81 along cross-section B-B as illustrated in FIG. 1, and FIG. 10C illustrates the recesses 81 along cross-section C-C as illustrated in FIG. 1.

In FIGS. 11A through 17D, epitaxial source/drain regions 82 are formed in the fins 52. In some embodiments, a material of the source/drain regions 82 is selected to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. The epitaxial source/drain regions 82 may extend into the fins 52. The gate spacers 86 may be used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52. In an embodiment, the epitaxial source/drain regions 82 may be epitaxially grown in the region 50P with a process that does not produce facets. In other embodiments, the epitaxial source/drain regions 82 may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of in a range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 82 may be in situ doped during growth.

FIGS. 11A through 13C illustrate the formation in the region 50N of epitaxial source/drain regions 82. In some embodiments, each of the epitaxial source/drain regions 82 comprises a first layer 82A, a second layer 82B, and a third layer 82C (as illustrated below in FIG. 13B). In other embodiments, the epitaxial source/drain regions 82 may have a fewer or greater number of layers.

Figure 11B:
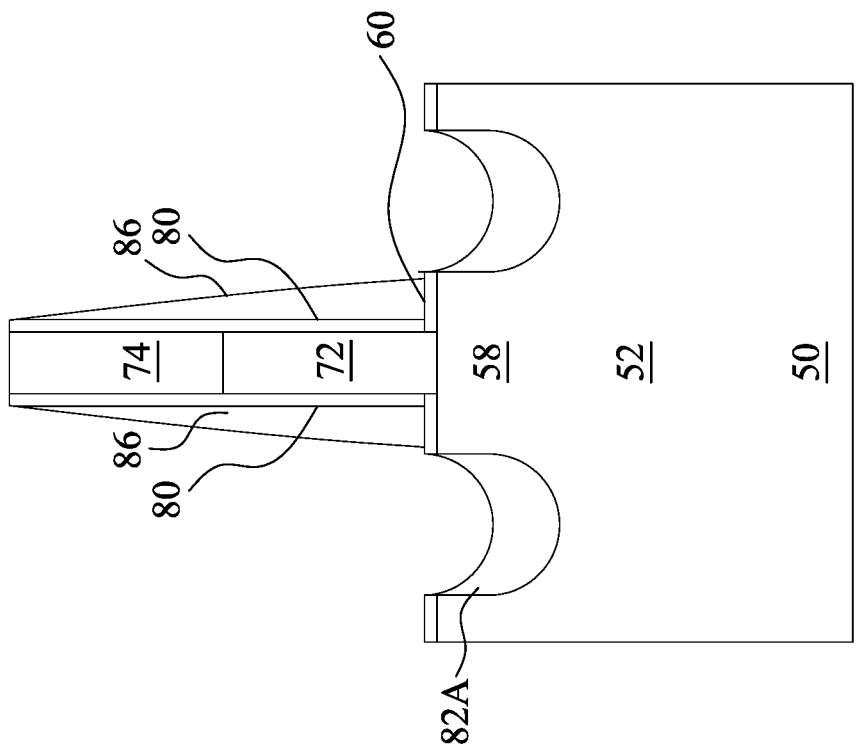
Figure 11A:
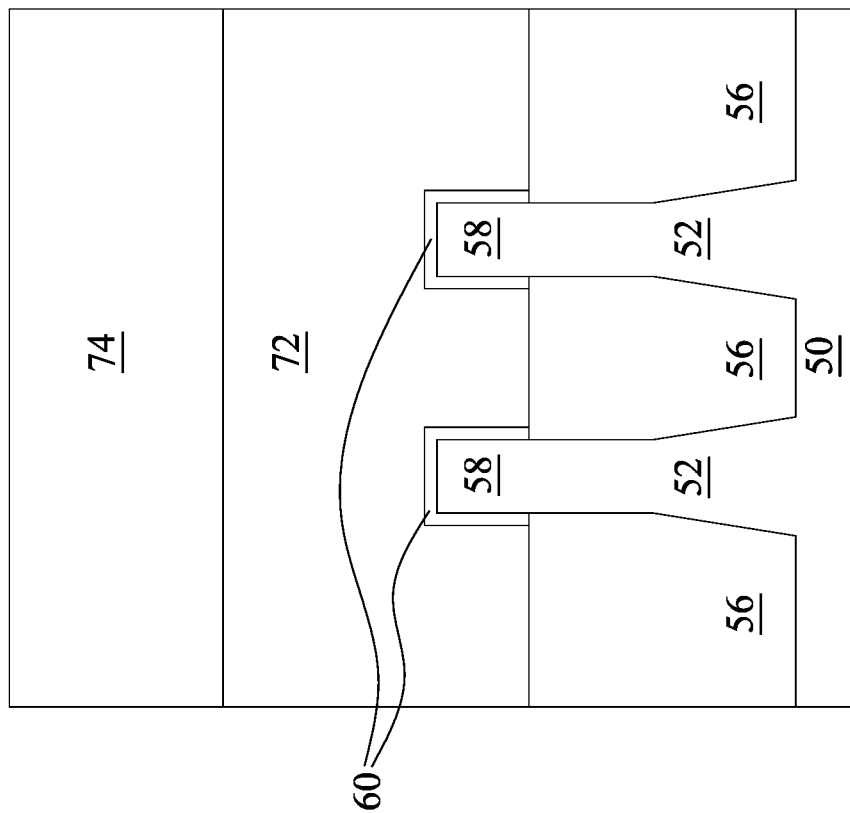
Figure 11C:
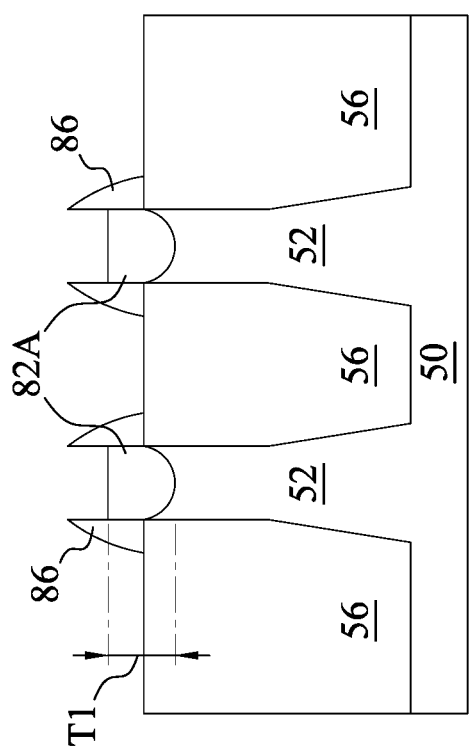

FIGS. 11B and 11C illustrates the formation of the first layer 82A, in accordance with some embodiments. Portions of the first layer 82A may be formed on bottom surfaces of the recesses 81. In some embodiments, the first layer 82A comprises silicon doped with arsenic, silicon lightly doped with phosphorus, silicon carbide, silicon carbon phosphide, or the like. The dopant concentration of the As, P, C, or the C and P in the Si may be less than about $1.0 \times 10^{21}$ atoms/cm$^3$, such as in a range of about $1.0 \times 10^{21}$ atoms/cm$^3$ to about $6.0 \times 10^{20}$ atoms/cm$^3$, as measured with secondary ion mass spectrometry (SIMS). In some embodiments, the first layer 82A has a dopant concentration of P less than $1.0 \times 10^{21}$ atoms/cm$^3$. The first layer 82A may be epitaxially grown using metal-organic CVD (MOCVD), molecular beam epitaxy (MBE), liquid phase epitaxy (LPE), vapor phase epitaxy (VPE), selective epitaxial growth (SEG), a combination thereof, or the like. The first layer 82A may be formed to a first thickness T1 in a range of about 2 nm to about 10 nm, measured as the shortest distance from a bottom point of the first layer 82A to the top surface of the first layer 82A.

Figure 12B:
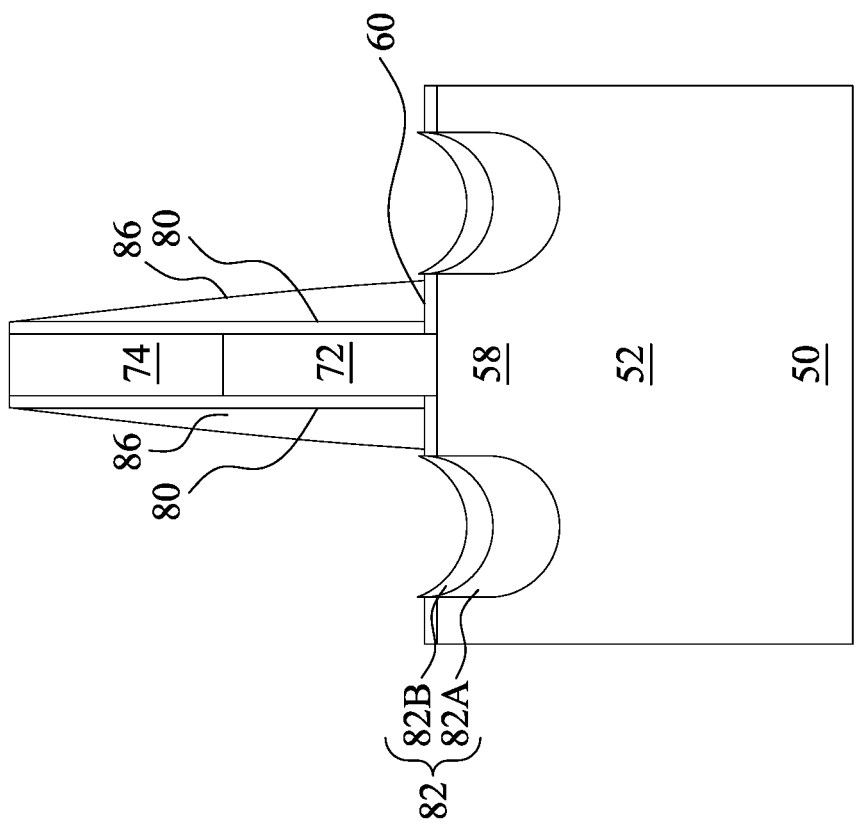
Figure 12A:
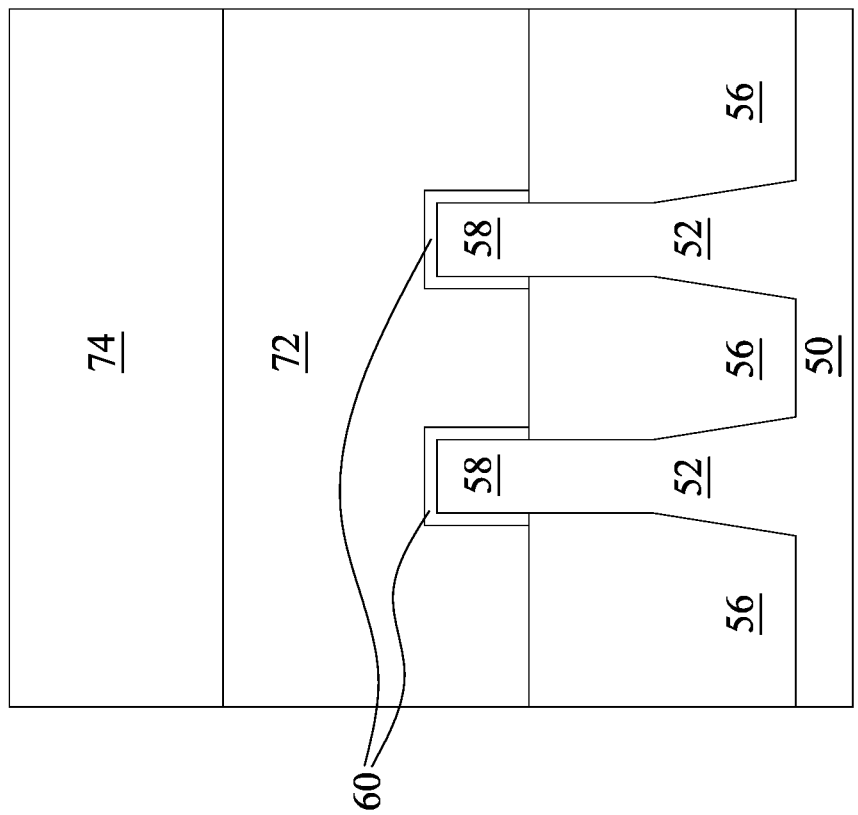
Figure 12C:
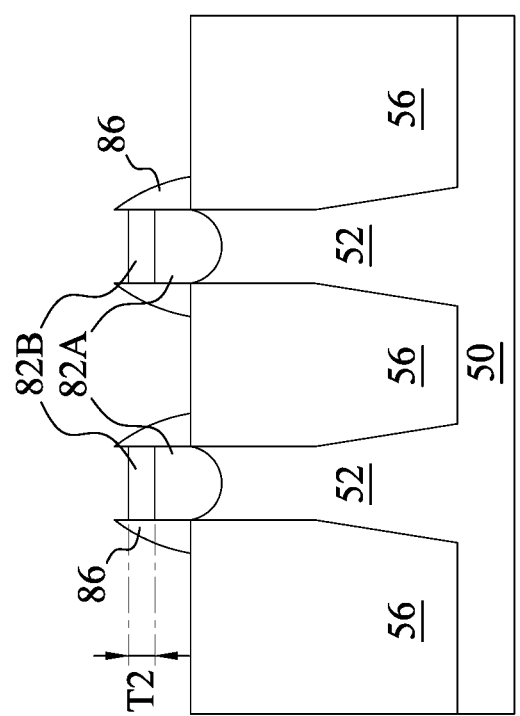

FIGS. 12B and 12C illustrate the formation of the second layer 82B, in accordance with some embodiments. The second layer 82B (also referred to as an intermediate source/drain layer) may be useful for raising the merge point of the portions of the epitaxial source/drain regions 82 (see below, FIG. 13C) by increasing the epitaxial growth in the vertical direction. This may reduce the formation of disadvantageous electric shorts between adjacent epitaxial source/drain regions 82, such as on neighboring double fins 53 (see below, FIG. 13E).

The second layer 82B may be epitaxially grown using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments in which the second layer 82B is formed of silicon doped by phosphorus, the epitaxial growth process uses a suitable Si precursor that promotes vertical growth of the second layer 82B and suppresses lateral growth of the second layer 82B. For example, the suitable Si precursor may be silane (SiH$_4$), DCS, the like, or a combination thereof. By using a silicon precursor that promotes vertical growth over lateral growth may be useful for producing bottom-up growth of the second layer 82B, reducing epitaxial growth of the second layer 82B on the sidewalls of the recess 81, and reducing the lateral width of the subsequently formed third layer 82C (see below, FIGS. 13B-C), which may reduce the formation of disadvantageous electric shorts. The epitaxial growth process may also use a suitable P precursor to provide a phosphorus source for in situ doping the epitaxial source/drain regions 82 during the epitaxial growth process. The suitable P precursor may be phosphine, phosphorus oxychloride, the like, or a combination thereof. In some embodiments, carrier gases such as hydrogen (H$_2$) can be mixed with the precursors.

In some embodiments, the formation of the second layer 82B uses a flow rate of the Si precursor in a range of about 20 sccm to about 50 sccm. A flow rate of the P precursor may be in a range of about 200 sccm to about 300 sccm. A flow rate of the carrier gas may be in a range of about 3000 sccm to about 10000 sccm. The epitaxial growth process may be performed at a temperature in a range of about 660° C. to about 720° C. and the epitaxial growth process may be performed at a pressure in a range of about 100 Torr to about 250 Torr. The formation process of the second layer 82B may be performed for a duration in a range of about 10 seconds to about 50 seconds, which may be useful for selectivity.

The second layer 82B may be formed to a second thickness T2 in a range of about 3 nm to about 7 nm, measured as the shortest distance from a bottom point of the second layer 82B to the top surface of the second layer 82B. The second thickness T2 being in a range of about 3 nm to about 7 nm may be advantageous for raising the merge point of the portions of the epitaxial source/drain regions 82 and reducing the formation of electrical shorts. The second thickness T2 being less than about 3 nm may be disadvantageous because the merge point of the portions of the epitaxial source/drain regions 82 may be insufficiently raised. The second thickness T2 being greater than about 7 nm may be disadvantageous because it may lead to increased selectivity loss. In some embodiments, the second layer 82B is less than 0.5 nm thicker measured along a sidewall of the second layer 82B than the thickness of the second layer measured as the shortest distance from a bottom point of the second layer 82B to the top surface of the second layer 82B.

The dopant concentration of phosphorus in the second layer 82B may be in a range of about $3.0 \times 10^{21}$ atoms/cm$^3$ to about $3.5 \times 10^{21}$ atoms/cm$^3$, as measured with secondary ion mass spectrometry (SIMS), which may be advantageous because it may provide better selectivity. The dopant concentration of phosphorus in the second layer 82B being less than about $3.0 \times 10^{21}$ atoms/cm$^3$ may be disadvantageous because it may lead to higher resistivity in the epitaxial source/drain regions 82. The dopant concentration of phosphorus in the second layer 82B being greater than about $3.5 \times 10^{21}$ atoms/cm$^3$ may be disadvantageous because it may lead to worse selectivity control. In some embodiments, the concentration of phosphorus in the second layer 82B is greater than the concentration of phosphorus in the first layer 82A.

Figure 13B:
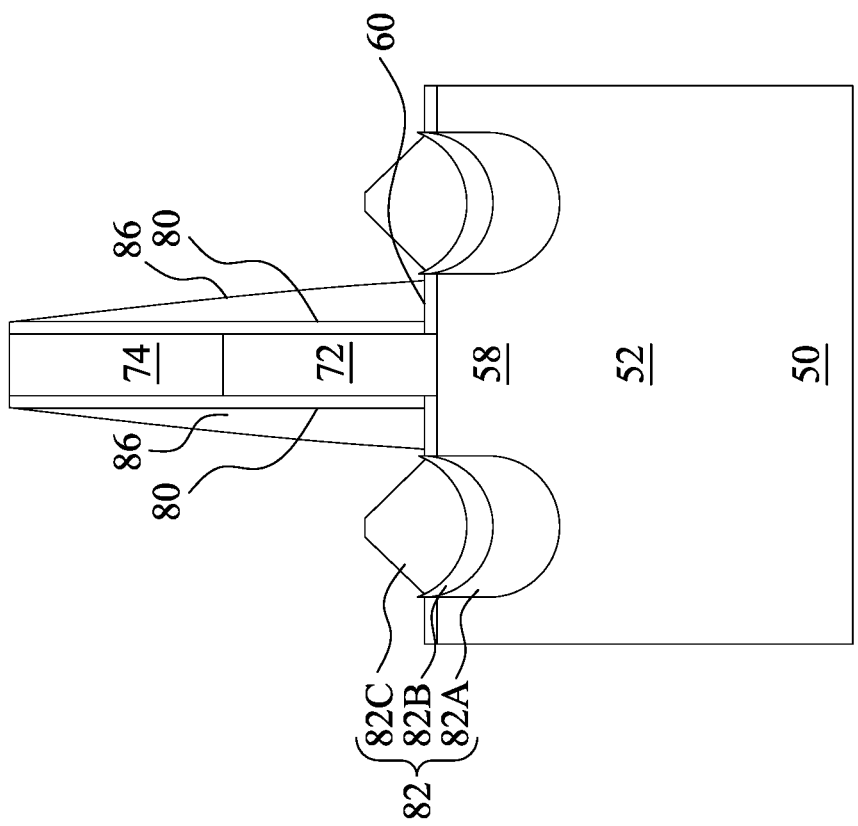
Figure 13A:
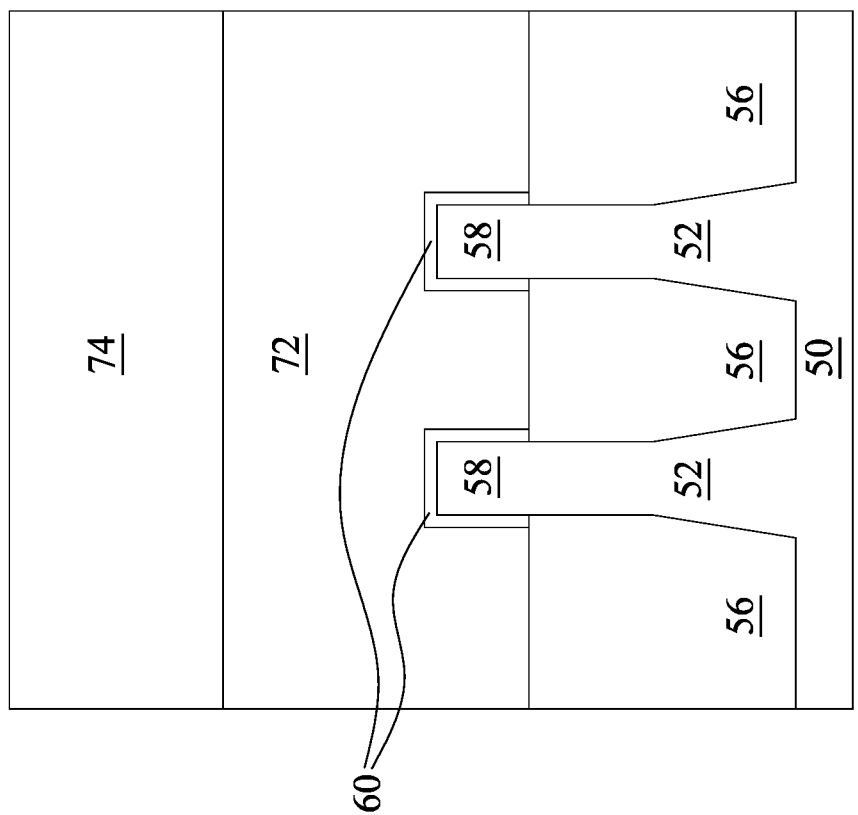
Figure 13C:
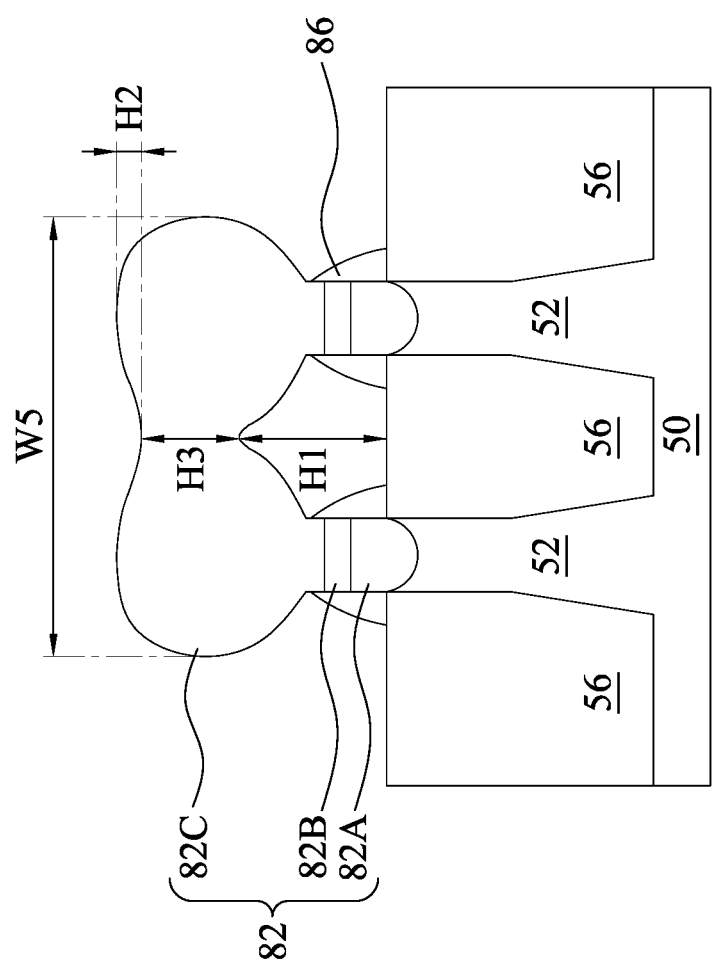

In FIGS. 13B and 13C, a third layer 82C is formed extending from the portions of the second layer 82B and merges into a single continuous source/drain region 82 extending from two or more fins 52, in accordance with some embodiments. As a result of the epitaxy processes used to form the third layer 82C, upper surfaces of the third layer 82C have facets which expand laterally outward beyond sidewalls of the fins 52. These facets cause adjacent portions of the third layer 82C of a same FinFET, such as FinFETs comprising double fins 53 as illustrated in FIG. 13E, to merge as illustrated by FIG. 13C. The third layer 82C can be formed using an epitaxy process such as a cyclic deposition-etch (CDE) process. The CDE process may be useful for producing a source/drain region with a flatter top surface, which may decrease contact resistance and improve device performance. The CDE process includes a number of repeated cycles, such as in a range from 2 cycles to 5 cycles. Each cycle of the CDE process includes a deposition process followed by an etch process. In some embodiments, the deposition process of the CDE process includes a chemical vapor deposition (CVD) process, such as reduced pressure chemical vapor deposition (RPCVD), low pressure CVD (LPCVD), the like, or a combination thereof.

In some embodiments in which the third layer 82C is formed of silicon doped by phosphorus, the epitaxial growth process uses a suitable Si precursor and a suitable P precursor. The P precursor provides a phosphorus source for in situ doping the epitaxial source/drain regions 82 during the epitaxial growth process. The suitable Si precursor may be selected to promote lateral growth of the third layer 82C over vertical growth of the third layer 82C such that the resulting third layer 82C has a top surface with improved planarity. For example, the suitable precursor may be dichlorosilane (DCS), silane, the like, or a combination thereof. The suitable P precursor may be phosphine, phosphorus oxychloride, the like, or a combination thereof. In some embodiments, carrier gases such as hydrogen can be mixed with the precursors. Using a Si precursor that promotes lateral growth and hydrogen as the carrier gas may be useful for producing bottom up lateral growth of the third layer 82C to merge the portions of the third layer 82C grown on neighboring fins 52 and produce a flatter top profile of the source/drain regions 82, which may decrease contact resistance and improve device performance. In some embodiments, vertical growth of the second layer 82B is greater while flowing the suitable Si precursor for the second layer 82B (such as e.g. silane) than vertical growth of the third layer 82C while flowing the suitable Si precursor for the third layer 82C (such as e.g. DCS), and lateral growth of the third layer 82C is greater while flowing the suitable Si precursor for the third layer 82C (such as e.g. DCS) than lateral growth of the second layer 82B while flowing the suitable Si precursor for the second layer 82B (such as e.g. silane).

In some embodiments, the formation of the third layer 82C uses a flow rate of the Si precursor in a range of about 800 sccm to about 1000 sccm. A flow rate of the dopant precursor may be in a range of about 200 sccm to about 300 sccm. A flow rate of the carrier gas may be in a range of about 3000 sccm to about 10000 sccm. The epitaxial growth process may be performed at a temperature in a range of about 660° C. to about 700° C. and the epitaxial growth process may be performed at a pressure in a range of about 200 Torr to about 350 Torr. The formation process of the third layer 82C may be performed for a duration in a range of about 60 seconds to about 300 seconds, which may be useful for forming a layer of SiP with a sufficiently high P concentration.

In some embodiments, the deposition process forms an epitaxial layer, such as e.g. SiP, on the second layer 82B and an amorphous material on non-crystalline surfaces. In some embodiments, after the deposition process, a post-deposition purge operation is used to remove the deposition gases from the process chamber. An inert gas, such as He, Ar, or Ne, may be used in this operation to purge the deposition gases from the process chamber. Once the deposition gases are removed from the chamber, the etch process follows.

The etching (or partial etching) process of the CDE process removes the amorphous material and may also remove a portion of the deposited epitaxial layer. The remaining epitaxial layer forms the third layer 82C. The etch process can be an in situ etch process performed in the chamber of the deposition process. In some embodiments, an etch gas is flowed into the chamber to etch the amorphous material. Etch gases such as HCl, $GeH_4$, the like, or a combination thereof can be used. A pressure during the etch process can be in a range from about 4 Torr to about 30 Torr. A temperature during the etch process can be in a range from about 720° C. to about 780° C. In some examples, after the etching process, a purge operation follows to remove the etching gases from the chamber.

The third layer 82C may be formed to a fifth width W5 measured as a maximum distance between opposite sidewalls in a range of about 53 to about 64 nm, such as about 57 to about 62 nm. The fifth width W5 being in a range of about 53 nm to about 64 nm may be advantageous for achieving a flatter top profile of the source/drain regions 82 that may decrease contact resistance and improve device performance. The fifth width W5 being less than about 53 nm may be disadvantageous because the top profile of the source/drain regions 82 may be insufficiently flat, leading to higher contact resistance. The fifth width W5 being greater than about 64 nm may be disadvantageous because it may lead to undesired merging between adjacent source/drain regions 82, forming electrical shorts.

In some embodiments, the third layer 82C merges to define an air gap 83 between the bottom surface of the third layer 82C and the STI region 56. The air gap 83 may have a first height H1 measured as the shortest distance from a top surface of the STI region 56 to a highest point (also referred to as a merge point) of the bottom surface of the third layer 82C between neighboring fins 52. The first height H1 may be in a range of about 30 nm to about 38 nm, which may be advantageous for reduced gate to source/drain capacitance, which may increase the AC performance of the subsequently formed device. For example, by increasing the first height H1 to the above range, an enlarged air gap 83 is defined, and parasitic capacitance can be reduced as a result of the air gap 83 having a low dielectric constant (e.g., approximately 1). In some embodiments the air gap 83 may include process gases used during the epitaxial growth of the third layer 82C. For example, the air gap 83 may comprise DCS, phosphine, hydrogen, nitrogen or the like. The first height H1 being less than about 30 nm may be disadvantageous because the merge point of the portions of the epitaxial source/drain regions 82 may be insufficiently raised, which may lead to a smaller volume of air in the air gap 83, increased gate to source/drain capacitance, and poorer AC performance of the subsequently formed device The first height H1 being greater than about 32 nm may be disadvantageous it may lead to the epitaxially grown SiP layers being broken between neighboring fins 52, which may cause high contact resistance in subsequently formed metal contacts. In some embodiments, the air gap 83 is subsequently filled by a first interlayer dielectric (ILD) 88 (see below, FIGS. 14A-14C). In other embodiments, the air gap 83 is not filled by the first ILD 88 and remains filled with air and/or remnants of process gases By forming the second layer 82B (see above, FIGS. 12B-C) with a silicon precursor such as e.g. silane that promotes vertical growth over lateral growth, the height of the third layer 82C may be raised, increasing the height H1 of the air gap 83 and raising the height of the merge point. This may be advantageous for reducing parasitic capacitance, which may increase the AC performance of the subsequently formed device.

In some embodiments, the top surface of the third layer 82C has a valley between the fins 52. The third layer 82C may have a second height H2 measured as the shortest distance from a lowest point of the valley to a surface level with the highest point of the third layer 82C in a range of less than about 16 nm. A second height H2 less than about 16 nm may be advantageous because it may provide a relatively flat landing site for a subsequently formed source/drain contact (see below, FIGS. 19A-C), which may decrease contact resistance and improve device performance. A second height H2 greater than about 16 nm may be disadvantageous because it may provide an uneven landing site for a subsequently formed source/drain contact, which may increase contact resistance and reduce device performance.

A third height H3, also referred to as a merge thickness, is measured as the shortest distance between the merge point of the bottom surface of the third layer 82C and the top surface of the third layer 82C. The third height H3 may be in a range of about 20 nm to about 35 nm, which may be advantageous for reducing gate to source/drain capacitance and improving device performance. A third height H3 less than about 20 nm may be disadvantageous because it may increase the likelihood of the source/drain region being damaged by a subsequent etching in order to form a metal contact etching (see below, FIGS. 19A-C), which may induce high resistivity. A third height H3 greater than about 35 nm may be disadvantageous because it may increase the height of the source/drain regions beyond desired dimensions.

The dopant concentration of the dopant, such as e.g. phosphorus, in the third layer 82C may be in a range of about $2.5 \times 10^{21}$ atoms/cm$^3$ to about $4.0 \times 10^{21}$ atoms/cm$^3$, as measured with secondary ion mass spectrometry (SIMS), which may be advantageous because it may have low resistivity. The dopant concentration of phosphorus in the third layer 82C being less than about $2.5 \times 10^{21}$ atoms/cm$^3$ may be disadvantageous because it may result in high resistivity. The dopant concentration of phosphorus in the third layer 82C being greater than about $4.0 \times 10^{21}$ atoms/cm$^3$ may be disadvantageous because it may have a poor selectivity window with respect to subsequently formed layers adjacent to the third layer 82C. In some embodiments, the concentration of phosphorus in the third layer 82C is greater than the concentration of phosphorus in the first layer 82A, and the concentration of phosphorus in the third layer 82C may also be greater than the concentration of phosphorus in the second layer 82B.

In some embodiments, additional layers (not illustrated) are formed over the third layer 82C to form the epitaxial source/drain regions 82. The additional layers may be doped silicon layers that substantially similar to the first layer 82A, the second layer 82B, or the third layer 82C and/or capping or protection layers comprising silicon. The additional layers may be formed using substantially similar methods and materials as the first layer 82A, the second layer 82B, or the third layer 82C.

Figure 13D:
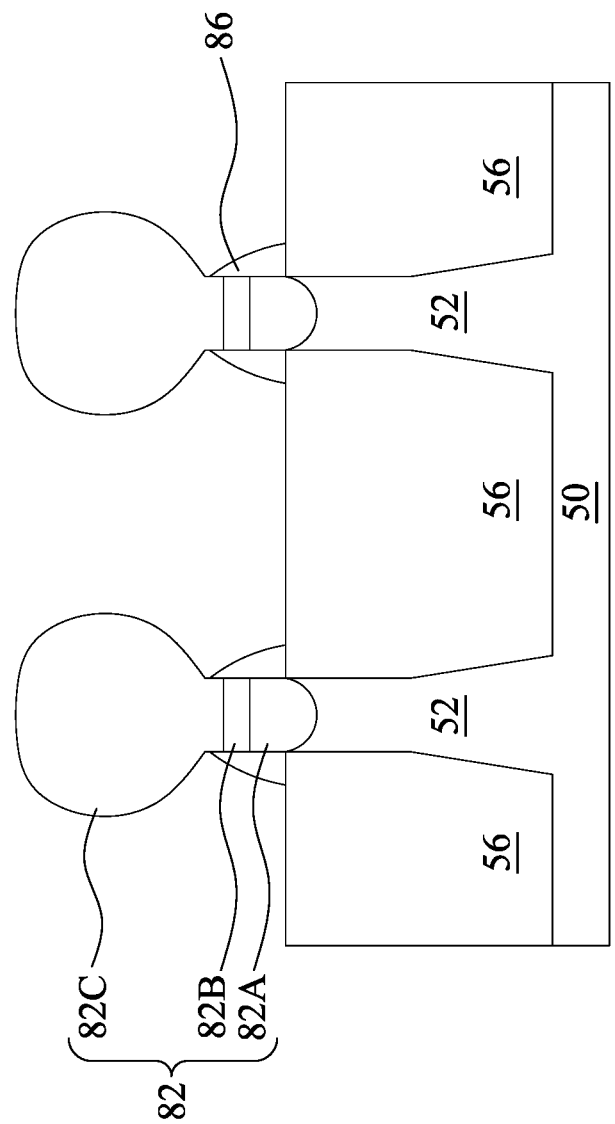
Figure 13E:
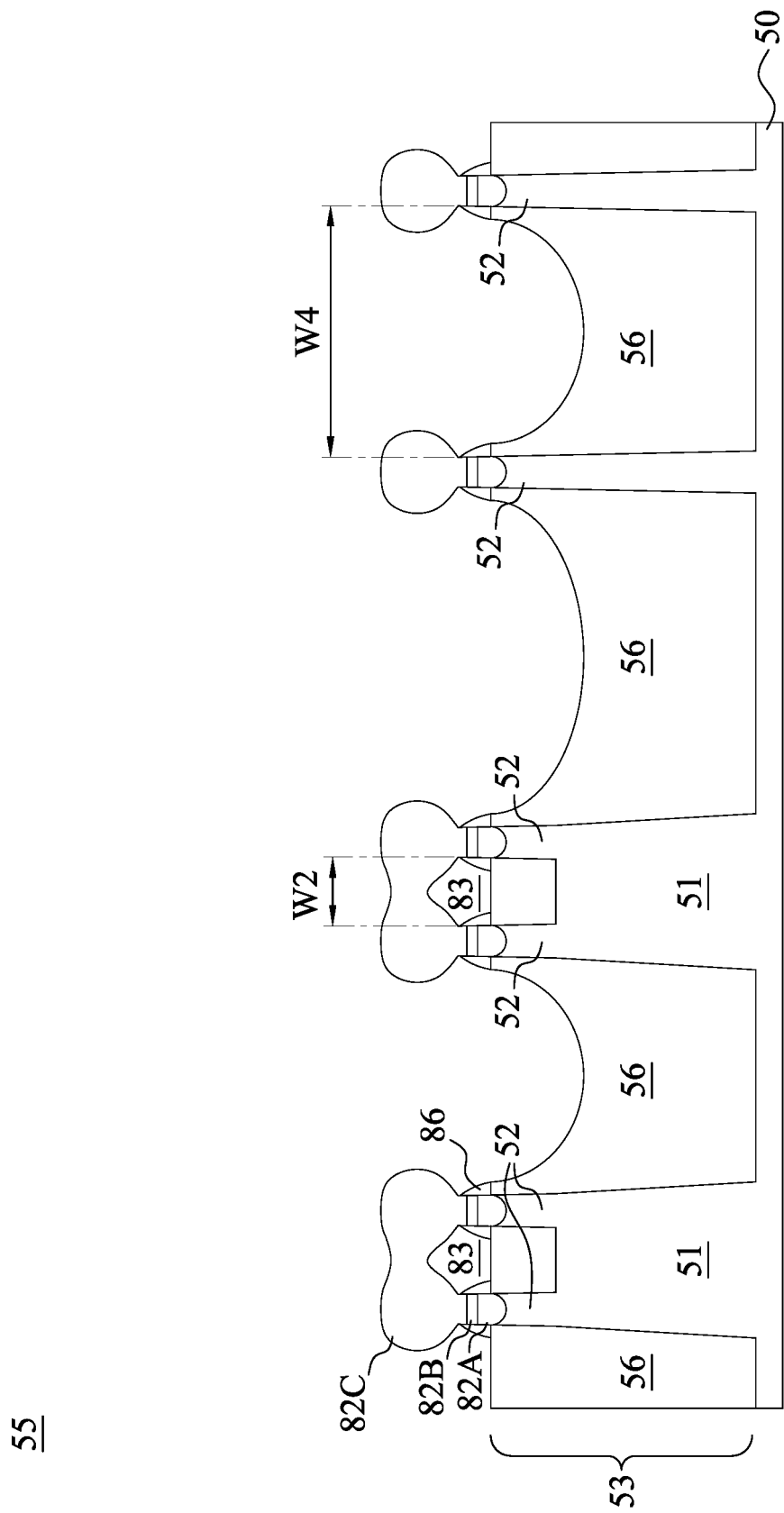

FIG. 13D illustrates epitaxial source/drain regions 82 formed extending from single fins 52 that do not merge with neighboring source/drain regions 82 on neighboring fins, in accordance with some embodiments. The source/drain regions 82 may be formed with substantially similar processes and materials as described above for the source/drain regions 82 with respect to FIGS. 11B through 13C, but the source/drain regions 82 do not merge with each other due to the single fins 52 being separated by a greater distance than the fins 52 illustrated in FIG. 13C above.

FIG. 13E illustrates the region 55 after epitaxial source/drain regions 82 are formed extending from the single fins 52 and double fins 53, in accordance with some embodiments. The source/drain regions 82 extending from the double fins 53 may merge as illustrated above in FIG. 13C due to the protruding fins 52 being separated by a width W2 in a range of about 12 nm to about 25 nm. The source/drain regions 82 extending from the single fins 52 may not merge due to the single fins 52 being 52 being separated by a width W4 in a range of about 30 nm to about 40 nm. In some embodiments, the single fins 52 with separate source/drain regions 82 and the double fins 53 with merged source/drain regions 82 may be used to form part of an SRAM cell, such as an n-type SRAM cell.

Figure 13F:
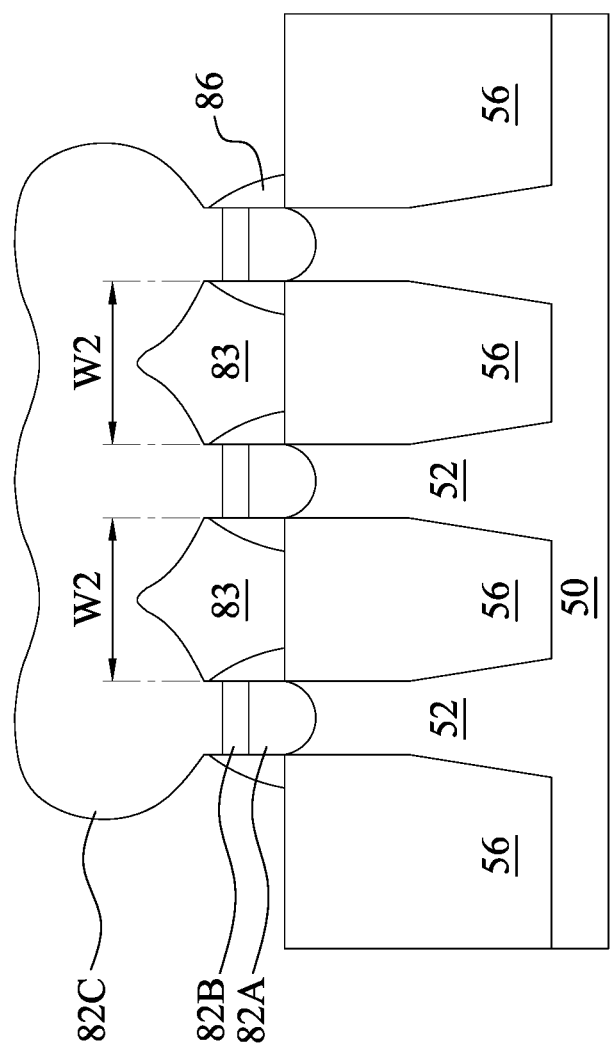

FIG. 13F illustrates a merged epitaxial source/drain region 82 extending from and merged across three neighboring fins 52, in accordance with some embodiments. The merged epitaxial source/drain region 82 of FIG. 13F may be formed using substantially similar methods and materials as described for the source/drain region 82 with respect to FIGS. 11B to 13C, except for being merged across three fins 52 due to the neighboring fins 52 being separated by widths W2 in a range of about 12 nm to about 25 nm. In some embodiments, a merged source/drain region 82 may be formed extending from four or more neighboring fins 52.

Figure 14B:
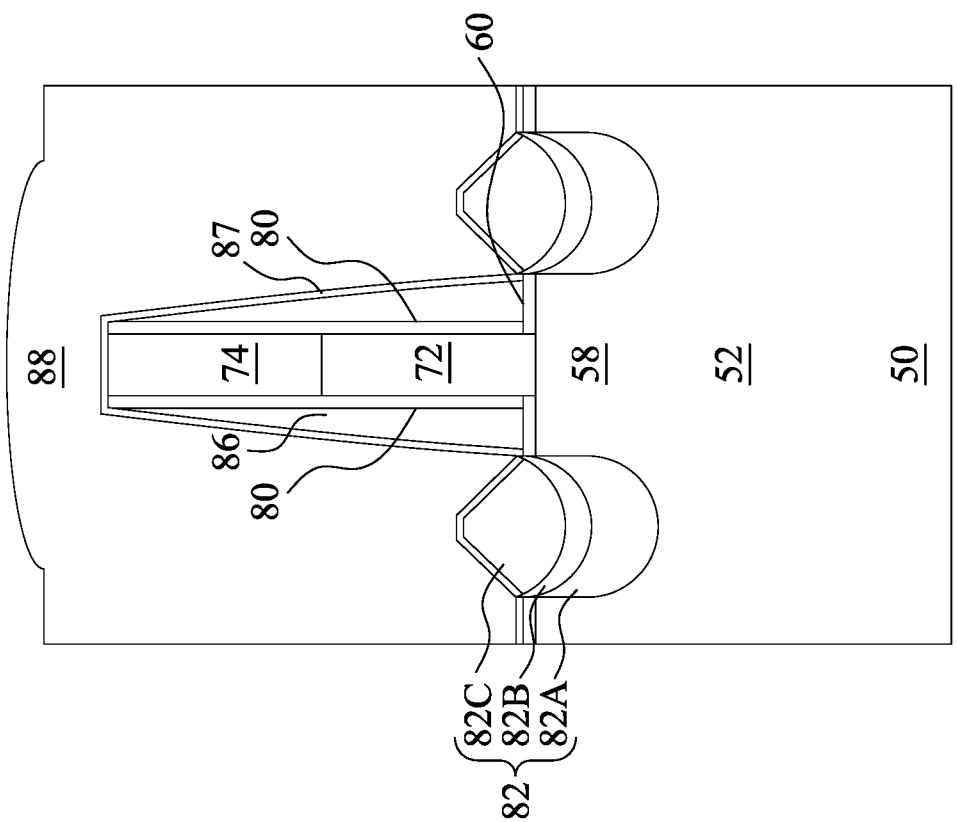
Figure 14A:
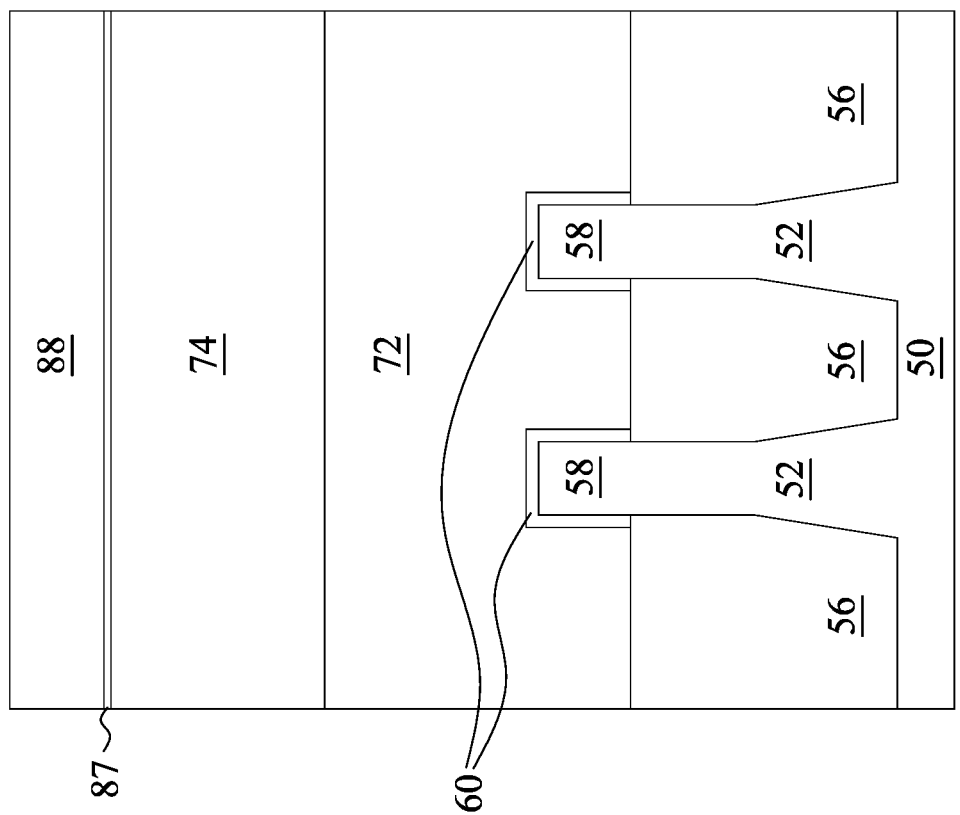
Figure 14C:
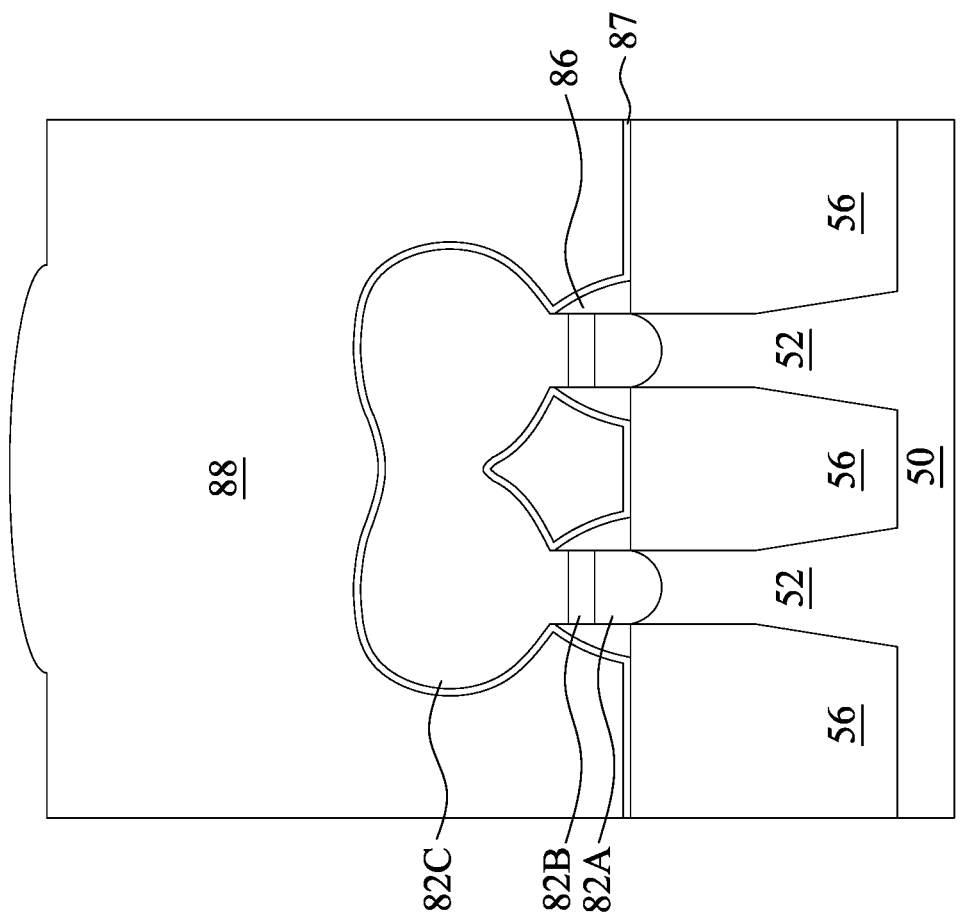

In FIGS. 14A, 14B, and 14C, a first interlayer dielectric (ILD) 88 is deposited over the structure illustrated in FIGS. 13A, 13B, and 13C. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88. In some embodiments, the CESL 87 and the first ILD 88 fill the air gap 83, as illustrated in FIG. 14C. In other embodiments (not illustrated), the CESL 87 and/or the first ILD 88 do not fill the air gap 83, and the air gap 83 remains filled with air and/or remnants of process gases.

Figure 15B:
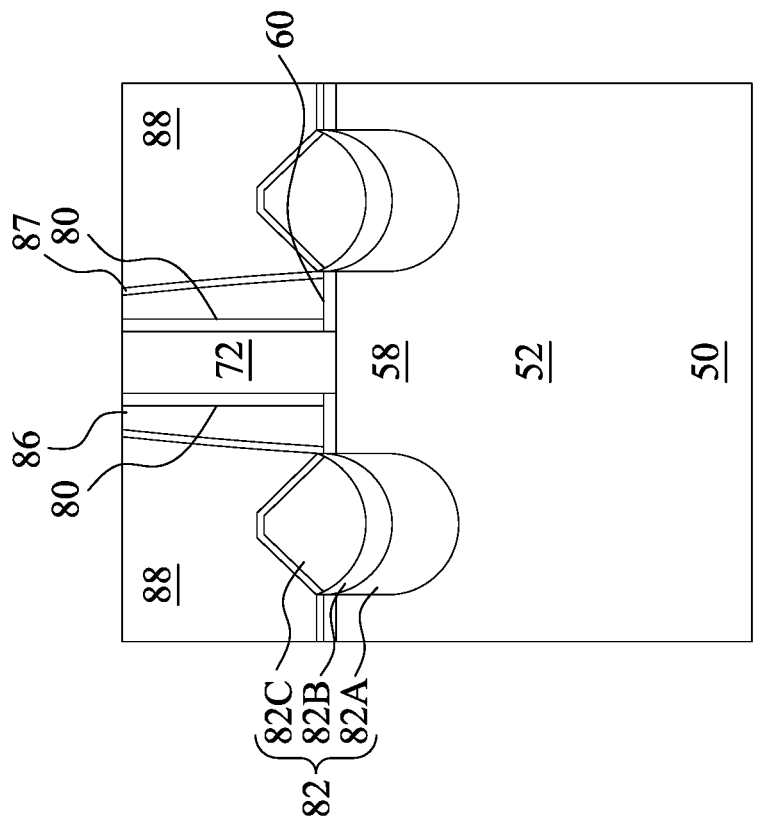
Figure 15A:
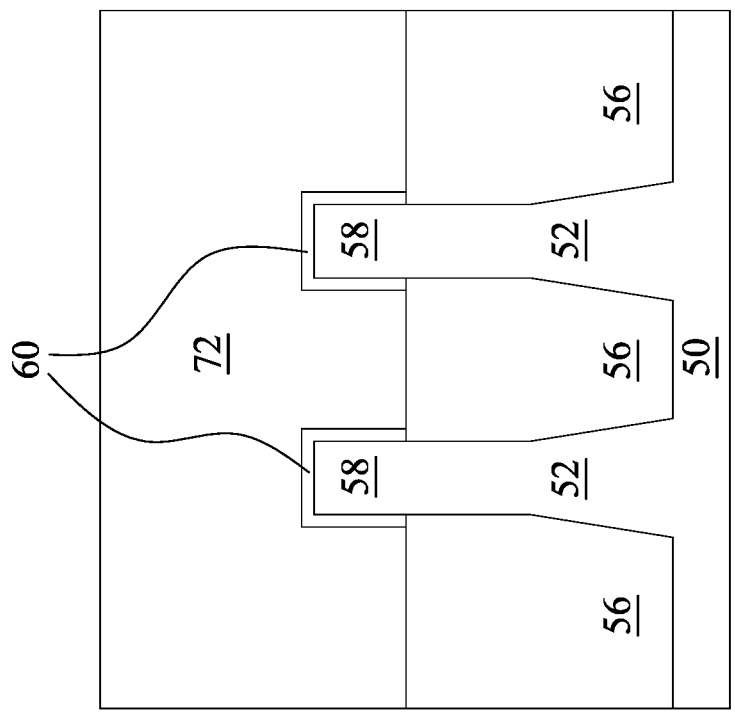
Figure 15C:
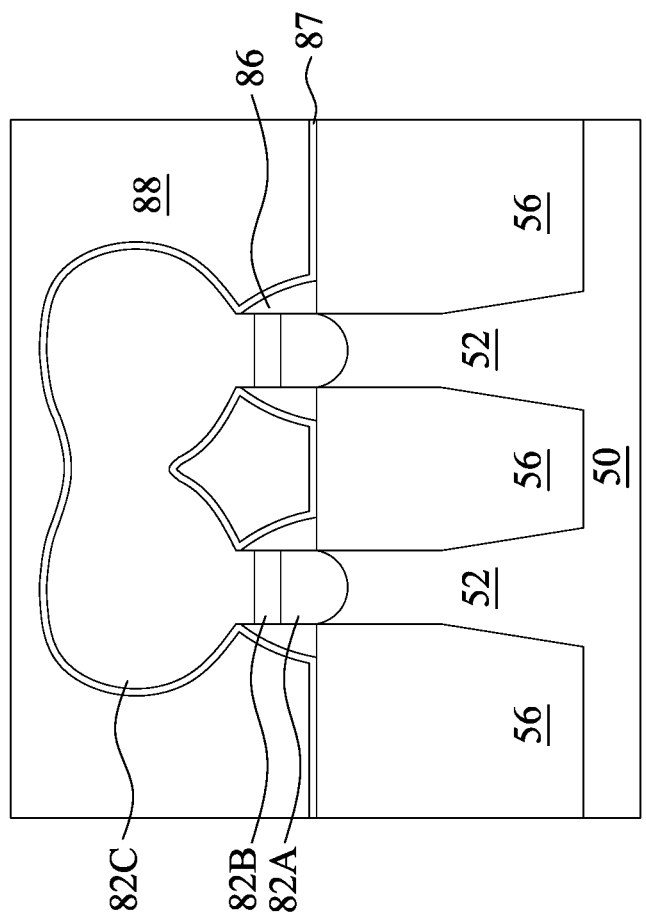

In FIGS. 15A, 15B, and 15C, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 16B:
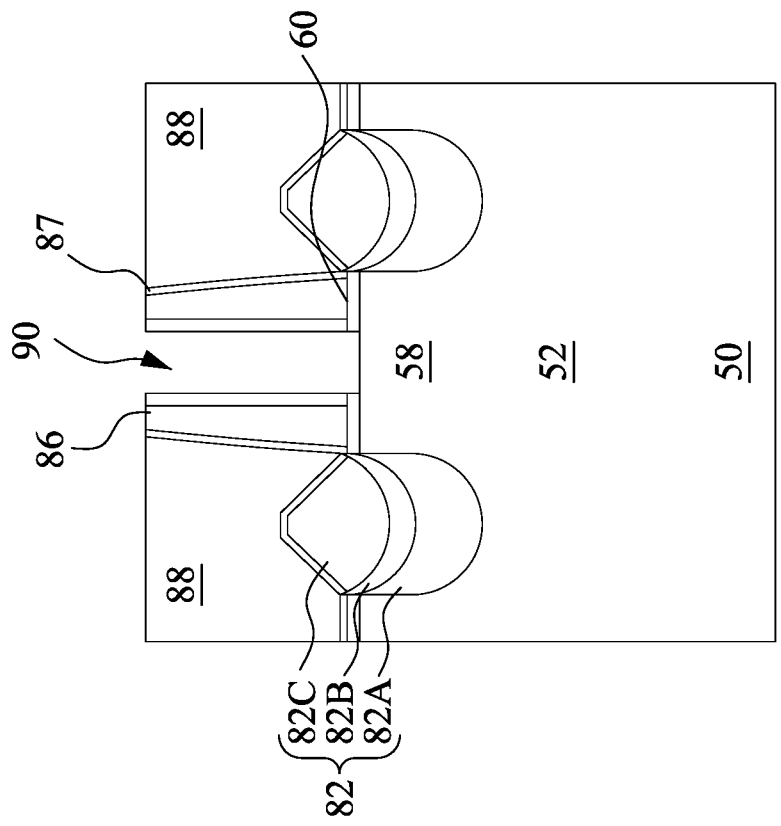
Figure 16A:
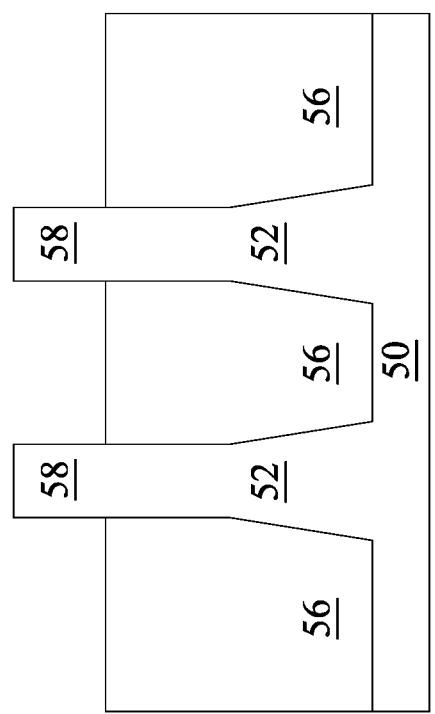
Figure 16C:
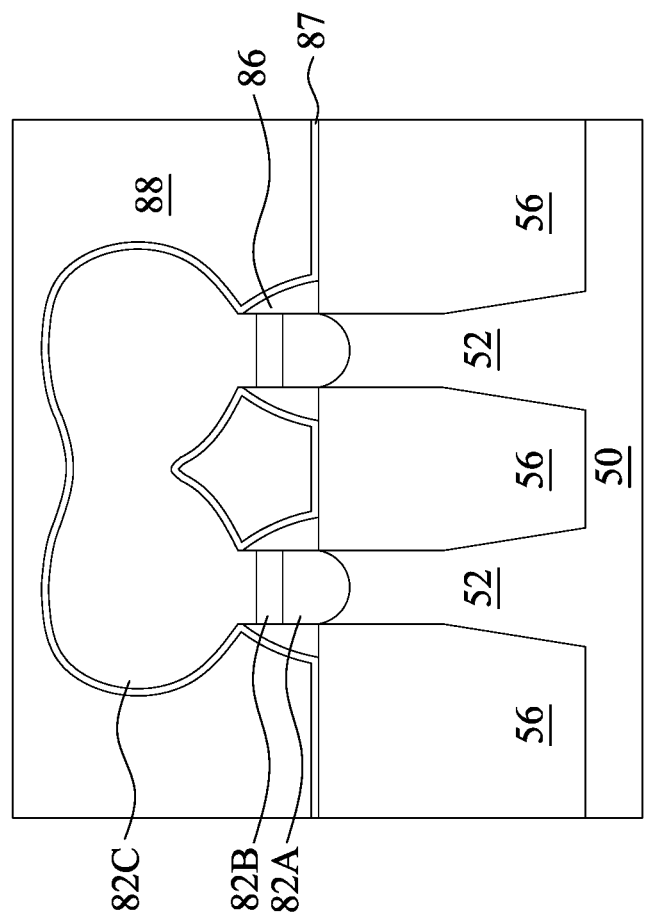

In FIGS. 16A, 16B, and 16C, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 17B:
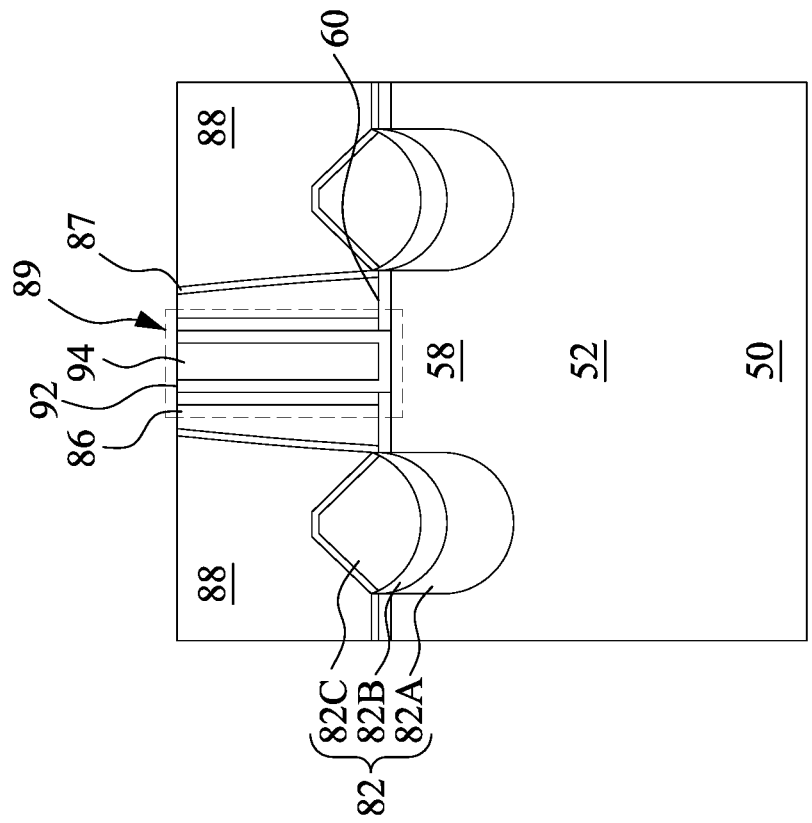
Figure 17A:
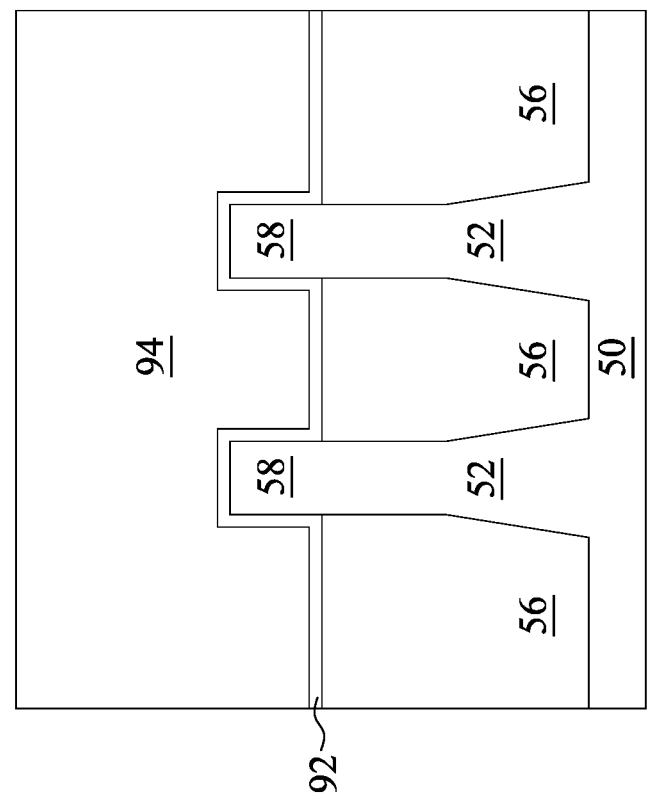
Figure 17C:
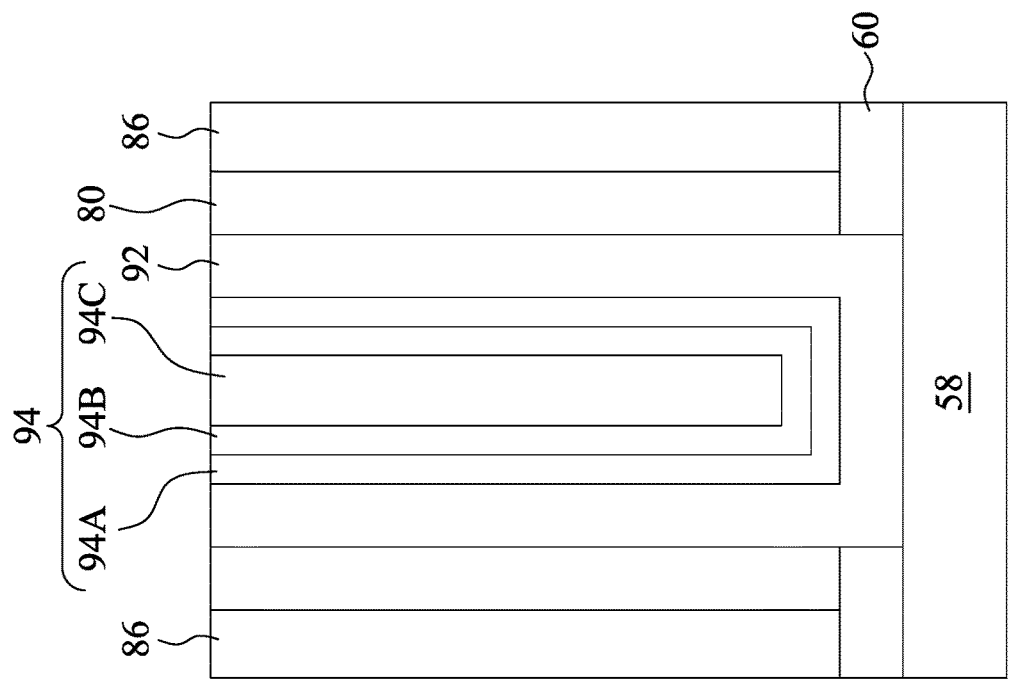
Figure 17D:
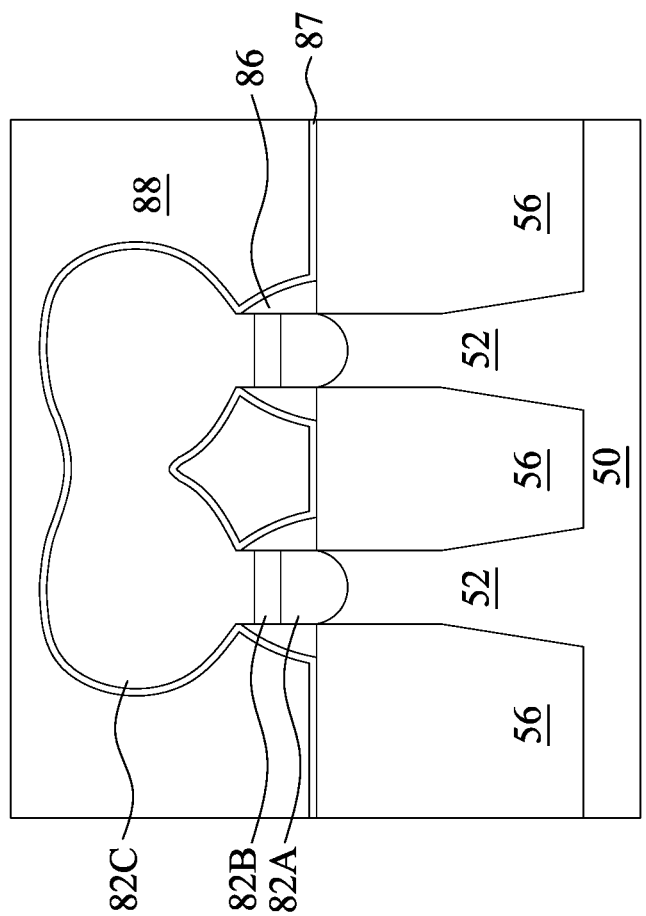

In FIGS. 17A4A and 17B, gate dielectric layers 92 and gate electrodes 94 are formed for replacement gates. FIG. 17C illustrates a detailed view of region 89 of FIG. 17B. FIG. 17D illustrates a view of the source/drain regions 82 in cross-section C-C. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 17C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18B:
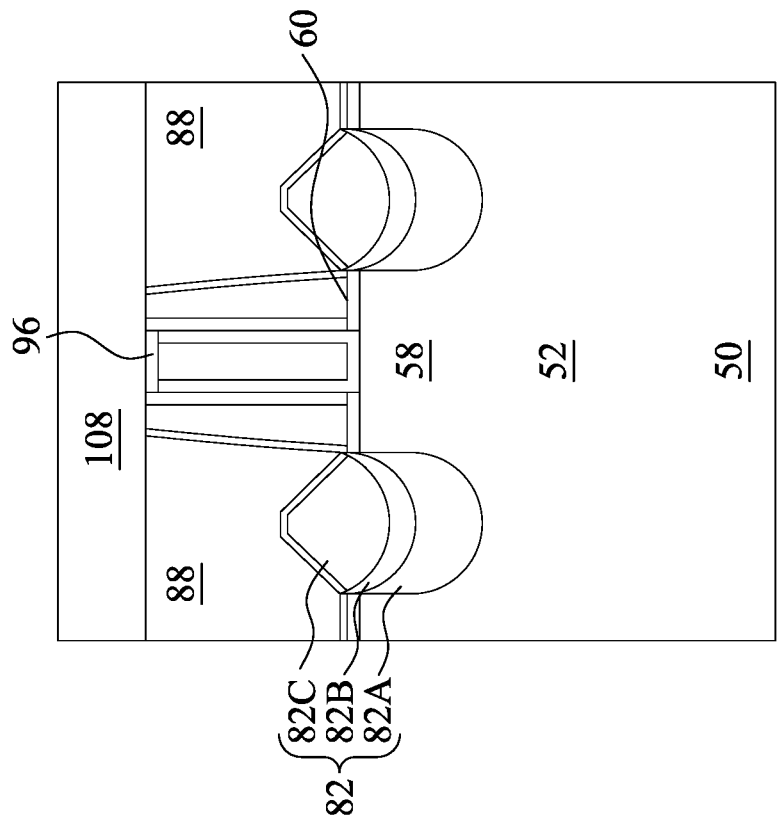
Figure 18A:
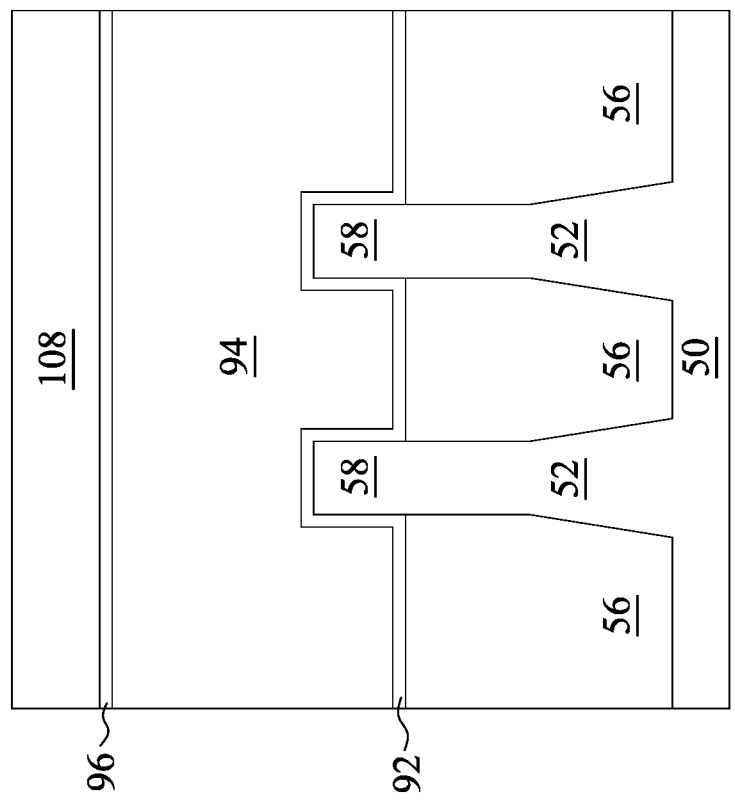
Figure 18C:
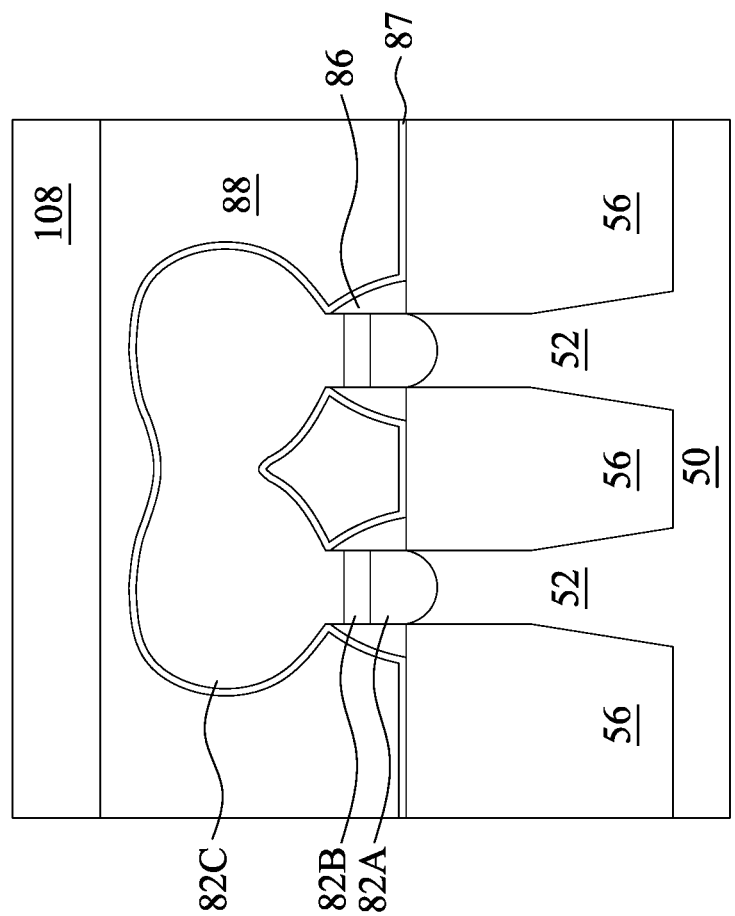

In FIGS. 18A, 18B, and 18C, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 18A, 18B, and 18C, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 16A and 16B) penetrate through the second ILD 108 and the gate mask 96 to contact the top surface of the recessed gate electrode 94.

Figure 19B:
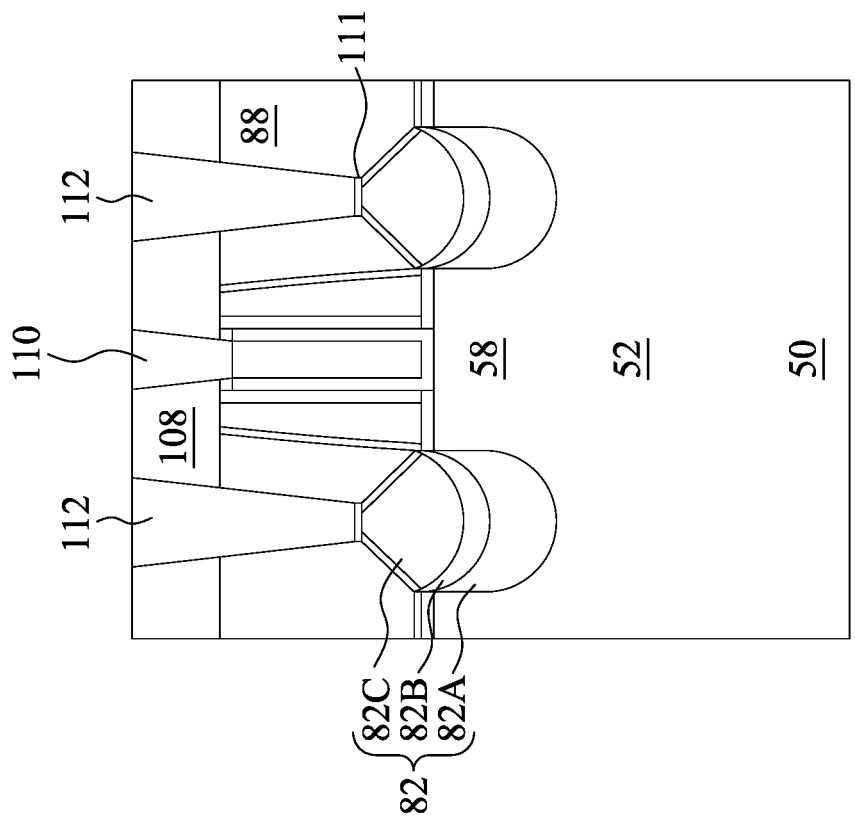
Figure 19A:
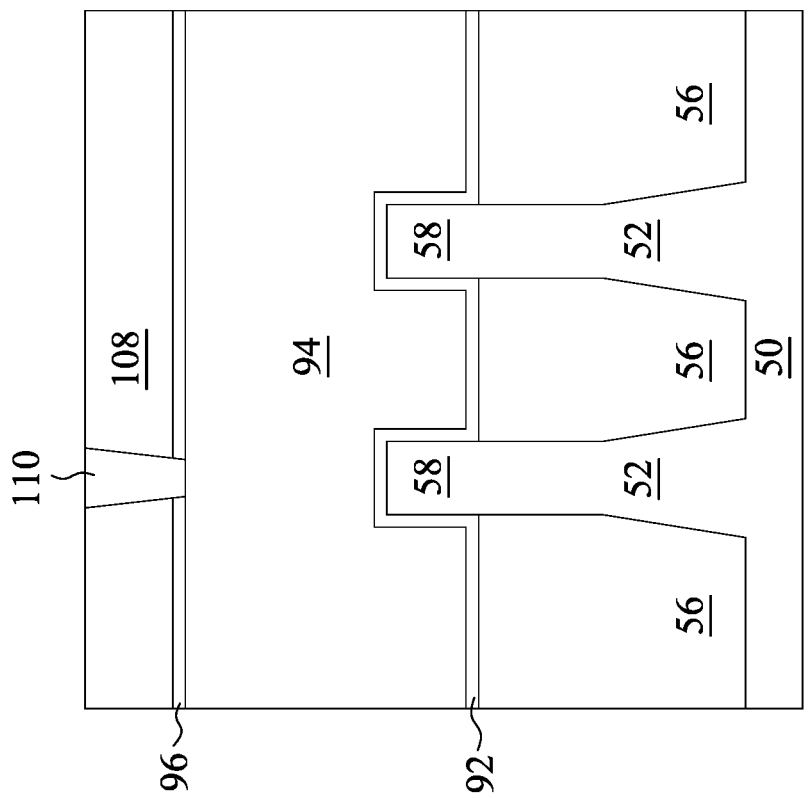
Figure 19C:
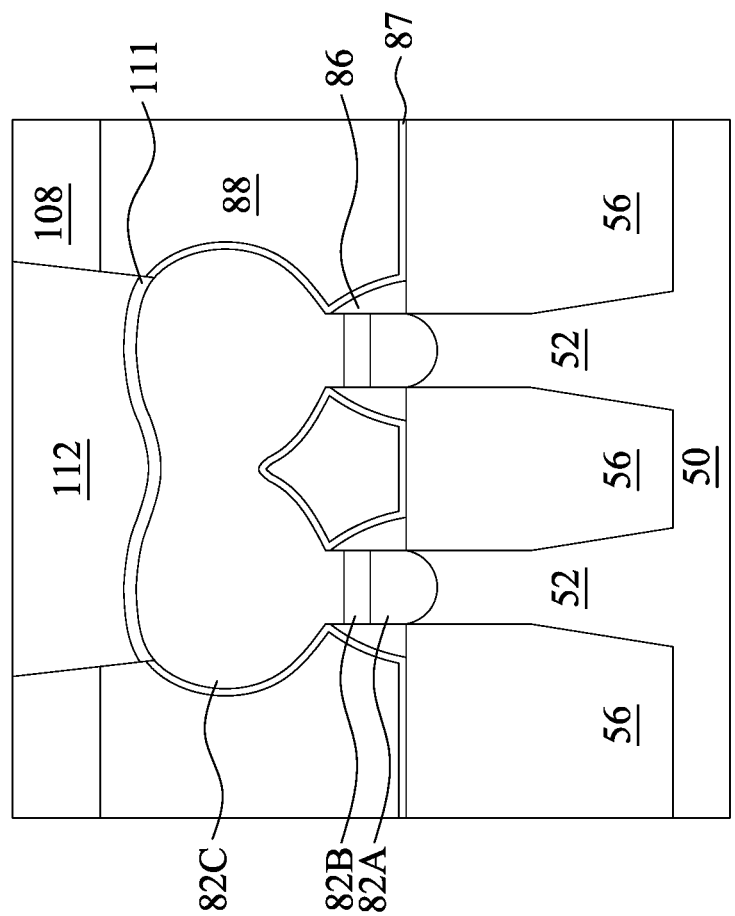

In FIGS. 19A, 19B, and 19C, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide 111 at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. patent Application Publication No. 2016/0365414, which is incorporated herein by reference in its entirety.

Embodiments may provide advantages. Large air gaps underneath source/drain regions may be produced with epitaxial growth techniques including an intermediate source/drain layer. Resulting increased merge heights of the source/drain regions may lead to reduced MOSFET gate to source/drain parasitic capacitance and improved AC performance of subsequently formed devices. The method of production may allow for a good process window, which may enable merging of neighboring source/drain regions without producing undesired electric shorts while also producing substantially flat top profiles of the source/drain regions to enable reduced contact resistance.

In accordance with an embodiment, a method of forming a semiconductor device, the method includes: forming a first gate structure over a first semiconductor fin and a second semiconductor fin, the first semiconductor fin and the second semiconductor fin protruding from a substrate; forming a first recess in the first semiconductor fin adjacent the first gate structure and forming a second recess in the second semiconductor fin adjacent the first gate structure; and forming a first source/drain region in the first recess and the second recess. The forming the first source/drain region includes: forming a first layer in the first recess and the second recess, the forming the first layer including forming a first portion of the first layer in the first recess and forming a second portion of the first layer in the second recess; forming a second layer on the first layer by flowing a silane gas, the forming the second layer including forming a third portion of the second layer on the first portion of the first layer and forming a fourth portion of the second layer on the second portion of the first layer; and forming a third layer on the second layer, the forming the third layer including flowing a dichlorosilane gas, the third layer being a single continuous material extending from the third portion of the second layer to the fourth portion of the second layer. In an embodiment, the first layer is formed to a thickness in a range of 2 nm to 10 nm. In an embodiment, the first layer includes Si doped with a dopant, the dopant including P, As, or C. In an embodiment, forming the second layer further includes flowing a phosphorus precursor, the phosphorus precursor including phosphine or phosphorus oxychloride. In an embodiment, the second layer has a thickness in a range of 3 nm to 7 nm. In an embodiment, forming the third layer includes a cyclic deposition-etch (CDE) process. In an embodiment, forming the third layer includes forming an air gap under the third layer. In an embodiment, a height of the air gap is in a range of 30 nm to 38 nm. In an embodiment, the method further includes the first source/drain region being formed in a third recess in a third semiconductor fin, the third semiconductor fin being adjacent the second semiconductor fin, a fifth portion of the first layer of the first source/drain region being formed in the third recess, a sixth portion of the second layer of the first source/drain region being formed on the fifth portion of the first layer, and the third layer physically contacting the sixth portion of the second layer.

In accordance with another embodiment, a method of forming a semiconductor device includes: forming a first recess in a first semiconductor fin, the first semiconductor fin protruding from a substrate; forming a second recess in a second semiconductor fin, the second semiconductor fin protruding from the substrate adjacent the first semiconductor fin; forming a first portion of a first source/drain layer in the first recess and forming a second portion of the first source/drain layer in the second recess; forming a first portion of a second source/drain layer on the first portion of the first source/drain layer and forming a second portion of the second source/drain layer on the second portion of the first source/drain layer, wherein forming the second source/drain layer includes flowing a first precursor with a hydrogen ambient; forming a third source/drain layer on the first portion of the second source/drain layer and the second portion of the second source/drain layer, the third source/drain layer being a single continuous layer extending from the first recess to the second recess, wherein forming the third layer including flowing a second precursor, wherein vertical growth of the second source/drain layer is greater while flowing the first precursor than vertical growth of the third layer while flowing the second precursor, and wherein lateral growth of the third source/drain layer is greater while flowing the second precursor than lateral growth of the second source/drain layer while flowing the first precursor; and forming a gate structure over the first semiconductor fin and the second semiconductor fin. In an embodiment, the first precursor is silane and the second precursor is dichlorosilane. In an embodiment, the second source/drain layer is doped with phosphorus to a density of phosphorus in a range of $3.0 \times 10^{21}$ atoms/cm$^3$ to $3.5 \times 10^{21}$ atoms/cm$^3$. In an embodiment, the second source/drain layer has a first thickness measured as the shortest distance from a bottom point of the second source/drain layer to the top surface of the second source/drain layer, the second source/drain layer has a second thickness measured along a sidewall of the second source/drain layer, and the second thickness is less than 0.5 nm greater than the first thickness. In an embodiment, the third layer has a first width in a range of 53 to 64 nm. In an embodiment, the top surface of the third source/drain layer has a valley between the first semiconductor fin and the second semiconductor fin, the third source/drain layer has a first height measured as the shortest distance from a lowest point of the valley to a surface level with the highest point of the third source/drain layer, and the first height is less than 16 nm. In an embodiment, the third source/drain layer has a second height measured as the shortest distance between a merge point of the third source/drain layer and the bottom surface of the third source/drain layer, the merge point being the highest point of the bottom surface of the third source/drain layer between the first semiconductor fin and the second semiconductor fin, the second height being in a range of 20 nm to 35 nm. In an embodiment, the third source/drain layer is doped with phosphorus to a density of phosphorus in a range of $2.5 \times 10^{21}$ atoms/cm$^3$ to $4.0 \times 10^{21}$ atoms/cm$^3$.

In accordance with yet another embodiment, a semiconductor device includes: a first semiconductor fin and a second semiconductor fin, the first semiconductor fin and the second semiconductor fin extending from a substrate; an isolation region disposed on the substrate between the first semiconductor fin and the second semiconductor fin; a gate electrode over the first semiconductor fin and the second semiconductor fin; and a source/drain region adjacent to the gate electrode and over the first semiconductor fin and the second semiconductor fin. The source/drain region includes: a first layer, a first portion of the first layer extending from the first semiconductor fin, a second portion of the first layer extending from the second semiconductor fin; a second layer, a third portion of the second layer extending from the first portion of the first layer, a fourth portion of the second layer extending from the second portion of the first layer; and a third layer, the third layer being a single continuous material extending from the third portion of the second layer to the fourth portion of the second layer, the third layer having a first height greater than 30 nm, the first height being measured as the shortest distance from a top surface of the isolation region to a merge point of the third layer, the merge point being a highest point of the bottom surface of the third layer between the first semiconductor fin and the second semiconductor fin. In an embodiment, the first layer has a density of phosphorus less than $1\times10^{21}$ atoms/cm$^3$, the second layer has a density of phosphorus in a range of $3.0\times10^{21}$ atoms/cm$^3$ to $3.5\times10^{21}$ atoms/cm$^3$, and the third layer has a density of phosphorus in a range of $2.5\times10^{21}$ atoms/cm$^3$ to $4.0\times10^{21}$ atoms/cm$^3$. In an embodiment, the semiconductor device further includes an air gap between the source/drain region and the isolation region, the air gap having a height in a range of 30 nm to 38 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first semiconductor fin and a second semiconductor fin, the first semiconductor fin and the second semiconductor fin extending from a substrate;
   an isolation region disposed on the substrate between the first semiconductor fin and the second semiconductor fin; and
   a source/drain region over the first semiconductor fin and the second semiconductor fin, the source/drain region comprising:
   a first layer, a first portion of the first layer extending from the first semiconductor fin, a second portion of the first layer extending from the second semiconductor fin;
   a second layer, a first portion of the second layer extending from the first portion of the first layer, a second portion of the second layer extending from the second portion of the first layer; and
   a third layer, the third layer being a single continuous layer extending from the first portion of the second layer to the second portion of the second layer, the third layer having a first height in a range from 30 nm to 38 nm, the first height being measured as the shortest distance from a top surface of the isolation region to a merge point of the third layer, the merge point being a highest point of a bottom surface of the third layer between the first semiconductor fin and the second semiconductor fin.

2. The semiconductor device of claim 1, wherein the first layer, the second layer, and the third layer comprise phosphorus.

3. The semiconductor device of claim 2, wherein the first layer has a concentration of phosphorus less than $1\times10^{21}$ atoms/cm$^3$.

4. The semiconductor device of claim 2, wherein the second layer has a concentration of phosphorus in a range from $3.0\times10^{21}$ atoms/cm$^3$ to $3.5\times10^{21}$ atoms/cm$^3$.

5. The semiconductor device of claim 2, wherein the third layer has a concentration of phosphorus in a range from $2.5\times10^{21}$ atoms/cm$^3$ to $4.0\times10^{21}$ atoms/cm$^3$.

6. The semiconductor device of claim 1, wherein the third layer is separated from the isolation region by an air gap.

7. The semiconductor device of claim 1, wherein the first portion of the second layer is separated from the second portion of the second layer.

8. A semiconductor device, comprising:
   a first semiconductor fin and a second semiconductor fin;
   an isolation region disposed between the first semiconductor fin and the second semiconductor fin;
   a source/drain region over the first semiconductor fin and the second semiconductor fin, the source/drain region comprising:
   a first layer, wherein a first portion of the first layer is in contact with the first semiconductor fin and a second portion of the first layer is in contact with the second semiconductor fin;
   a second layer, wherein a first portion of the second layer is in contact with the first portion of the first layer and a second portion of the second layer is in contact with the second portion of the first layer, and wherein the first portion of the second layer is separated from the second portion of the second layer; and
   a third layer, wherein the third layer is a single continuous layer in contact with the first portion of the second layer and the second portion of the second layer, and wherein an air gap is between the third layer and the isolation region; and
   a spacer along a sidewall of the first portion of the first layer, a sidewall of the first portion of the second layer, and a sidewall of the third layer, wherein the spacer overlaps an interface between the first portion of the first layer and the first portion of the second layer, and wherein the spacer overlaps an interface between the first portion of the second layer and the third layer.

9. The semiconductor device of claim 8, wherein the third layer has a concave lower surface.

10. The semiconductor device of claim 9, wherein a vertical distance between a highest point of the concave lower surface of the third layer and a top surface of the isolation region is greater than 30 nm.

11. The semiconductor device of claim 8, wherein the third layer has a concave upper surface.

12. The semiconductor device of claim 11, wherein a vertical distance between a highest point of the concave upper surface of the third layer and a lowest point of the concave upper surface of the third layer is less than 16 nm.

13. The semiconductor device of claim 8, wherein a concentration of phosphorus in the second layer is larger than a concentration of phosphorus in the first layer.

14. The semiconductor device of claim 13, wherein a concentration of phosphorus in the third layer is larger than the concentration of phosphorus in the second layer.

15. A semiconductor device, comprising:
a first semiconductor fin and a second semiconductor fin;
an isolation region disposed between the first semiconductor fin and the second semiconductor fin; and
a source/drain region over the first semiconductor fin and the second semiconductor fin, the source/drain region comprising:
- a first layer, wherein a first portion of the first layer is in contact with the first semiconductor fin and a second portion of the first layer is in contact with the second semiconductor fin;
- a second layer, wherein a first portion of the second layer is in contact with the first portion of the first layer and a second portion of the second layer is in contact with the second portion of the first layer; and
- a third layer, wherein the third layer is a single continuous layer in contact with the first portion of the second layer and the second portion of the second layer, wherein the third layer has a concave upper surface and a concave lower surface, and wherein a vertical distance between a highest point of the concave lower surface of the third layer and a lowest point of the concave upper surface of the third layer is in a range from 20 nm to 35 nm.

16. The semiconductor device of claim 15, wherein an air gap is between the concave lower surface of the third layer and the isolation region.

17. The semiconductor device of claim 15, further comprising a spacer in contact with a sidewall of the first portion of the first layer, a sidewall of the first portion of the second layer, and a sidewall of the third layer, wherein a top portion of the spacer is above a top surface of the first portion of the second layer, and wherein a bottom portion of the spacer is below a bottom surface of the first portion of the second layer.

18. The semiconductor device of claim 15, wherein the first portion of the second layer is separated from the second portion of the second layer.

19. The semiconductor device of claim 15, wherein the first layer has a thickness in a range from 2 nm to 10 nm.

20. The semiconductor device of claim 15, wherein the second layer has a thickness in a range from 3 nm to 7 nm.

* * * * *